US012593496B2

(12) United States Patent
Huang et al.

(10) Patent No.: US 12,593,496 B2
(45) Date of Patent: Mar. 31, 2026

(54) MULTIPLE THRESHOLD VOLTAGE IMPLEMENTATION THROUGH LANTHANUM INCORPORATION

(71) Applicant: Taiwan Semiconductor Manufacturing Co., Ltd., Hsinchu (TW)

(72) Inventors: Wen-Hung Huang, Hsinchu (TW); Kuo-Feng Yu, Zhudong Township (TW); Jian-Hao Chen, Hsinchu (TW); Shan-Mei Liao, Hsinchu (TW); Jer-Fu Wang, Taipei City (TW); Yung-Hsiang Chan, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 49 days.

(21) Appl. No.: 18/303,173

(22) Filed: Apr. 19, 2023

(65) Prior Publication Data

US 2023/0253256 A1 Aug. 10, 2023

Related U.S. Application Data

(62) Division of application No. 16/939,610, filed on Jul. 27, 2020, now Pat. No. 11,664,279.

(Continued)

(51) Int. Cl.
*H10D 84/03* (2025.01)
*H01L 21/28* (2025.01)
(Continued)

(52) U.S. Cl.
CPC ..... *H10D 84/038* (2025.01); *H01L 21/28185* (2013.01); *H10D 64/691* (2025.01); *H10D 84/0144* (2025.01); *H10D 84/834* (2025.01)

(58) Field of Classification Search
CPC . H01L 21/8238–823892; H01L 27/092–0928; H01L 27/11807;
(Continued)

(56) References Cited

U.S. PATENT DOCUMENTS 7,855,105 B1 * 12/2010 Jagannathan ...... H10D 84/0144
438/153
9,012,319 B1 4/2015 Choi et al.
(Continued)

FOREIGN PATENT DOCUMENTS

CN 109216198 A 1/2019
CN 109427590 A 3/2019
(Continued)

*Primary Examiner* — Julio J Maldonado
*Assistant Examiner* — Stanetta D Isaac
(74) *Attorney, Agent, or Firm* — Slater Matsil, LLP

(57) ABSTRACT

A method includes forming a first gate dielectric, a second gate dielectric, and a third gate dielectric over a first semi-conductor region, a second semiconductor region, and a third semiconductor region, respectively. The method fur-ther includes depositing a first lanthanum-containing layer overlapping the first gate dielectric, and depositing a second lanthanum-containing layer overlapping the second gate dielectric. The second lanthanum-containing layer is thinner than the first lanthanum-containing layer. An anneal process is then performed to drive lanthanum in the first lanthanum-containing layer and the second lanthanum-containing layer into the first gate dielectric and the second gate dielectric, respectively. During the anneal process, the third gate dielectric is free from lanthanum-containing layers thereon.

20 Claims, 29 Drawing Sheets

Related U.S. Application Data

(60) Provisional application No. 62/978,365, filed on Feb. 19, 2020.

(51) Int. Cl.
H10D 64/68 (2025.01)
H10D 84/01 (2025.01)
H10D 84/83 (2025.01)

(58) Field of Classification Search
CPC ....... H01L 27/11894; H01L 29/04–045; H01L 29/16–1608; H01L 29/18–185; H01L 29/22–2206; H01L 29/36–365; B81C 2203/0728; B81C 2203/0735; B81C 2203/0742; H10D 84/834; H10D 30/024; H10D 30/62; H10D 64/017; H10D 62/151; H10D 84/0158; H10D 84/83; H10D 64/691; H10D 84/038; H10D 84/0144

See application file for complete search history.

(56) References Cited

U.S. PATENT DOCUMENTS

| | | | |
|---|---|---|---|
| 9,105,490 | B2 | 8/2015 | Wang et al. |
| 9,177,865 | B2 | 11/2015 | Kim et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 10,529,629 | B2 | 1/2020 | Huang et al. |
| 10,672,886 | B2 | 6/2020 | More et al. |
| 10,867,799 | B2 | 12/2020 | Wang et al. |
| 11,011,433 | B2 | 5/2021 | More et al. |
| 11,189,714 | B2 | 11/2021 | Huang et al. |
| 11,380,774 | B2 | 7/2022 | Lim et al. |
| 11,699,621 | B2 | 7/2023 | Lee et al. |
| 2010/0164007 | A1* | 7/2010 | Onishi ................... H10B 10/00 |
| | | | 257/E27.098 |
| 2019/0006487 | A1 | 1/2019 | Huang et al. |
| 2021/0119058 | A1 | 4/2021 | Park et al. |

FOREIGN PATENT DOCUMENTS

| | | | |
|---|---|---|---|
| CN | 110310889 | A | 10/2019 |
| KR | 20140142957 | A | 12/2014 |
| KR | 20150051147 | A | 5/2015 |
| KR | 20170034747 | A | 3/2017 |
| KR | 20180069673 | A | 6/2018 |
| KR | 20190109142 | A | 9/2019 |
| KR | 20200005418 | A | 1/2020 |
| TW | 201911391 | A | 3/2019 |
| TW | 201913881 | A | 4/2019 |
| TW | 201914010 | A | 4/2019 |
| TW | 201945372 | A | 12/2019 |
| TW | 201946159 | A | 12/2019 |

* cited by examiner

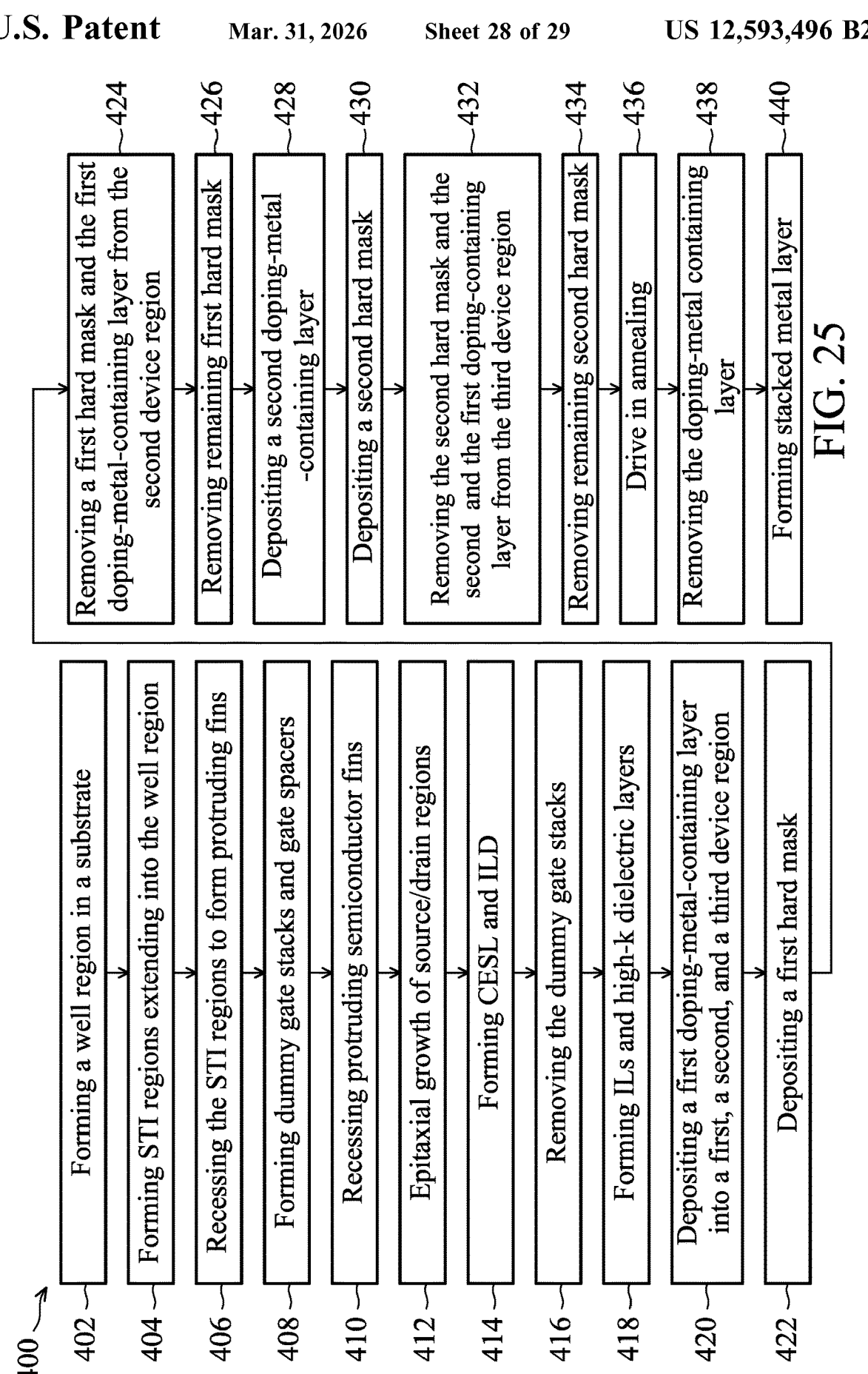

402 — Forming a well region in a substrate

404 — Forming STI regions extending into the well region

406 — Recessing the STI regions to form protruding fins

408 — Forming dummy gate stacks and gate spacers

410 — Recessing protruding semiconductor fins

412 — Epitaxial growth of source/drain regions

414 — Forming CESL and ILD

416 — Removing the dummy gate stacks

418 — Forming ILs and high-k dielectric layers

420 — Depositing a first doping-metal-containing layer into a first, a second, and a third device region 422 — Depositing a first hard mask 424 — Removing a first hard mask and the first doping-metal-containing layer from the second device region 426 — Removing remaining first hard mask 428 — Depositing a second doping-metal-containing layer 430 — Depositing a second hard mask 432 — Removing the second hard mask and the second and the first doping-containing layer from the third device region 434 — Removing remaining second hard mask 436 — Drive in annealing 438 — Removing the doping-metal containing layer 440 — Forming stacked metal layer

MULTIPLE THRESHOLD VOLTAGE IMPLEMENTATION THROUGH LANTHANUM INCORPORATION

PRIORITY CLAIM AND CROSS-REFERENCE

This application is a divisional of U.S. patent application Ser. No. 16/939,610, filed Jul. 27, 2020, and entitled "Multiple Threshold Voltage Implementation Through Lanthanum Incorporation," which claims the benefit of the U.S. Provisional Application No. 62/978,365, filed on Feb. 19, 2020, and entitled "Multiple Threshold Voltage Implementation Through Lanthanum Incorporation," which applications are hereby incorporated herein by reference.

BACKGROUND

Metal-Oxide-Semiconductor (MOS) devices typically include metal gates, which are formed to solve poly-depletion effect in conventional polysilicon gates. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be generated at the surface of the semiconductor.

Metal gates may include a plurality of layers, so that the different requirements of NMOS devices and PMOS devices can be met. The formation of metal gates typically involves removing dummy gate stacks to form trenches, depositing a plurality of metal layers extending into the trenches, forming metal regions to fill the remaining portions of the trenches, and then performing a Chemical Mechanical Polish (CMP) process to remove excess portions of the metal layers. The remaining portions of the metal layers and metal regions form metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 25 illustrates a process flow for forming FinFETs in accordance with some embodiments.

DETAILED DESCRIPTION

Figure 1:
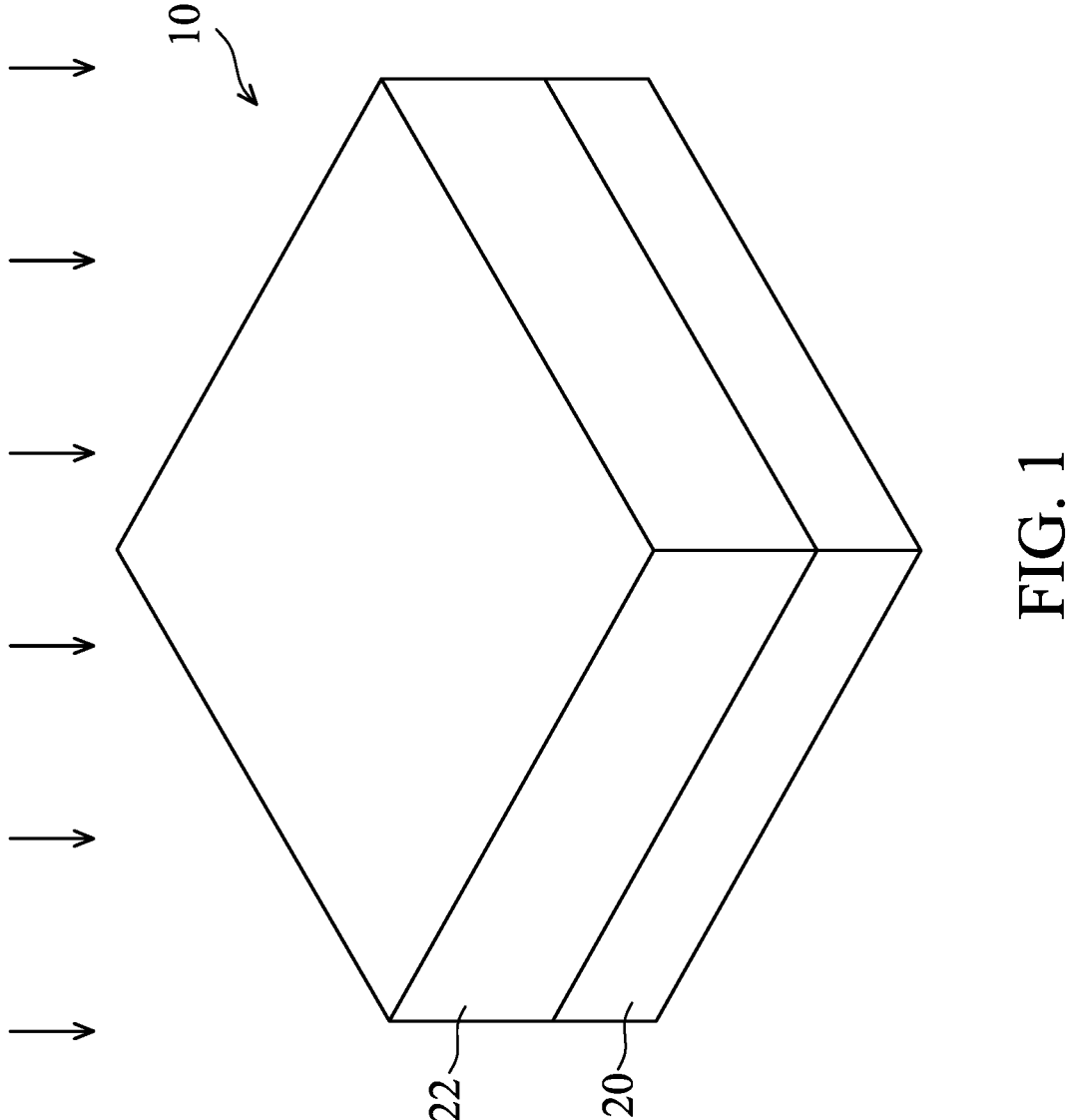
FIGS. 1-6, 7A, 7B, 8A, 8B, 9-19, 20A, and 20B illustrate the perspective views and cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The methods of tuning threshold voltages of transistors with high-k gate dielectrics are provided in accordance with some embodiments. The intermediate stages of forming the transistors are illustrated in accordance with some embodiments. Some variations of some embodiments are discussed. Throughout the various views and illustrative embodiments, like reference numbers are used to designate like elements. In accordance with some embodiments, the formation of Fin Field-Effect Transistors (FinFETs) is used as an example to explain the concept of the present disclosure. Other types of transistors such as planar transistors and Gate-All-Around (GAA) transistors may also be formed adopting the concept of the present disclosure. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed as being performed in a particular order, other method embodiments may be performed in any logical order.

In accordance with some embodiments of the present disclosure, two doping-metal-containing layers (which may comprise lanthanum as the doping metal, and are hence lanthanum-containing layers) are formed on a first high-k dielectric layer in a first transistor region. One doping-metal-containing layer is formed over a second high-k dielectric layer. In a third transistor region, no doping-metal-containing layer is formed. An anneal process is performed to drive the doping metals in the doping-metal-containing layers into the respective underlying high-k dielectric layers, so that the threshold voltages of the first transistor and the second transistor are increased or decreased (tuned). The threshold voltage of the third transistor, without the doping metal doped into the respective high-k dielectric layer, is not tuned. The tuning in the threshold voltages of the first and the second transistors are different from each other due to the difference in the thicknesses of the doping-metal-containing layer(s). Accordingly, the threshold voltages of some transistors are selectively tuned to different levels. It is appreciated that more than two (such as three, four, or five, and so on) doping-metal-containing layers may also be adopted for further tuning the threshold voltages of additional transistors.

FIGS. 1-6, 7A, 7B, 8A, 8B, 9-19, 20A, and 20B illustrate the cross-sectional views and perspective views of intermediate stages in the formation of Fin Field-Effect Transistors (FinFETs) in accordance with some embodiments of the present disclosure. The processes shown in these figures are also reflected schematically in the process flow 400 shown in FIG. 25.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 402 in the process flow 400 shown in FIG. 25. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
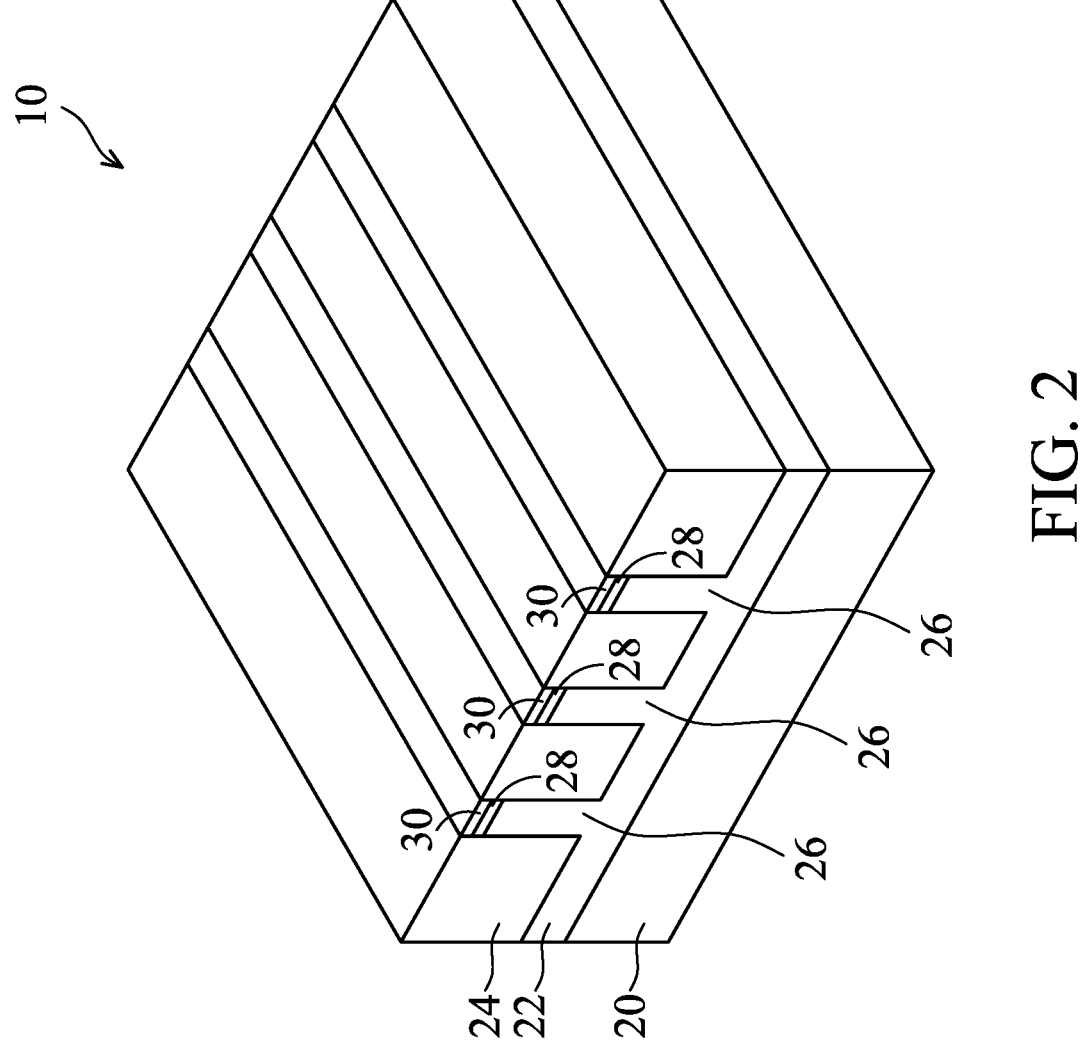

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 404 in the process flow 400 shown in FIG. 25. The portions of substrate 20 between neighboring STI regions 24 are referred to as semiconductor strips 26. To form STI regions 24, pad oxide layer 28 and hard mask layer 30 may be formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through the thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), Chemical Vapor Deposition (CVD), or the like. STI regions 24 also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard mask layers 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
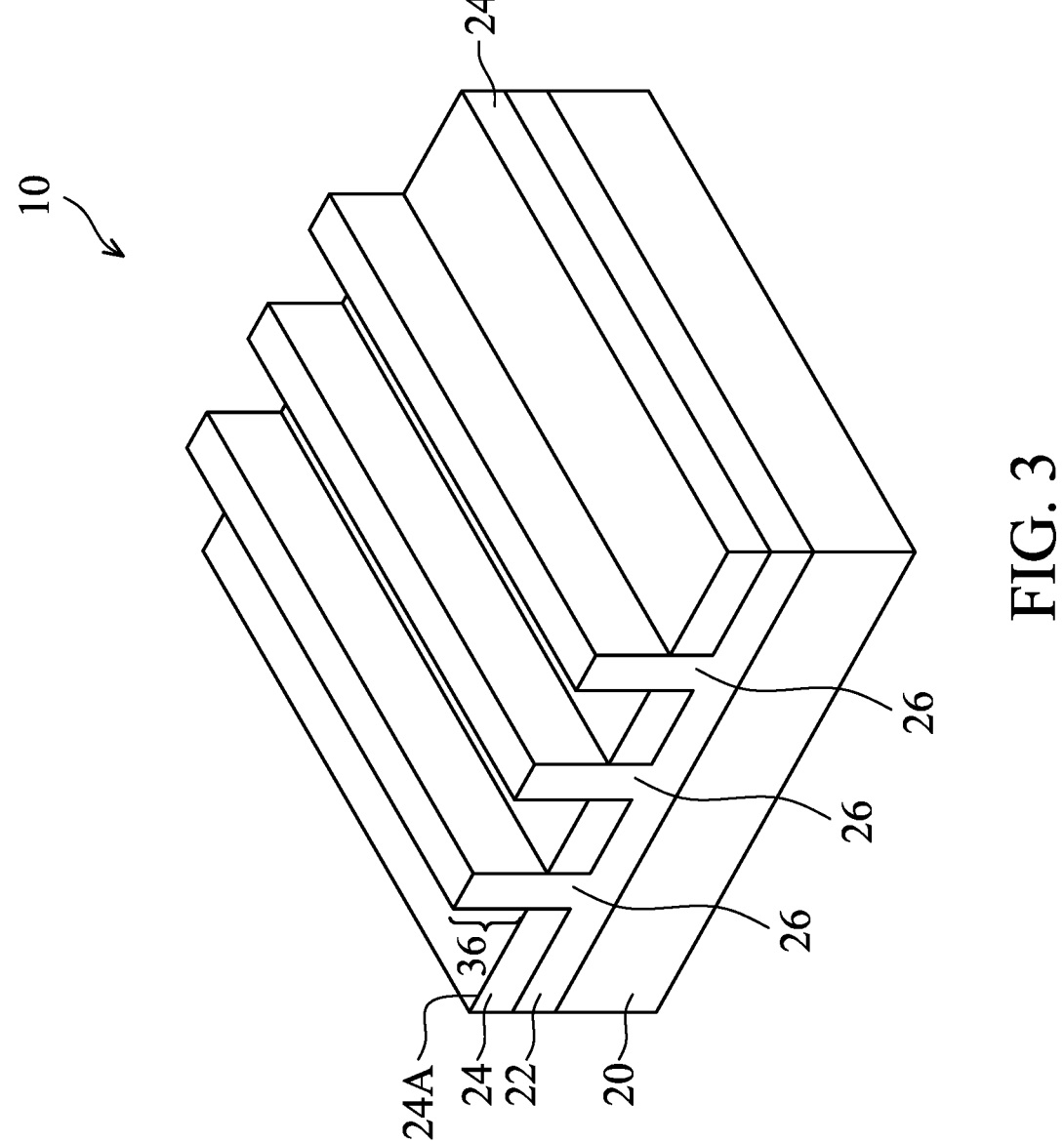

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 406 in the process flow 400 shown in FIG. 25. The etching may be performed using a dry etching process, wherein HF and NH3, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
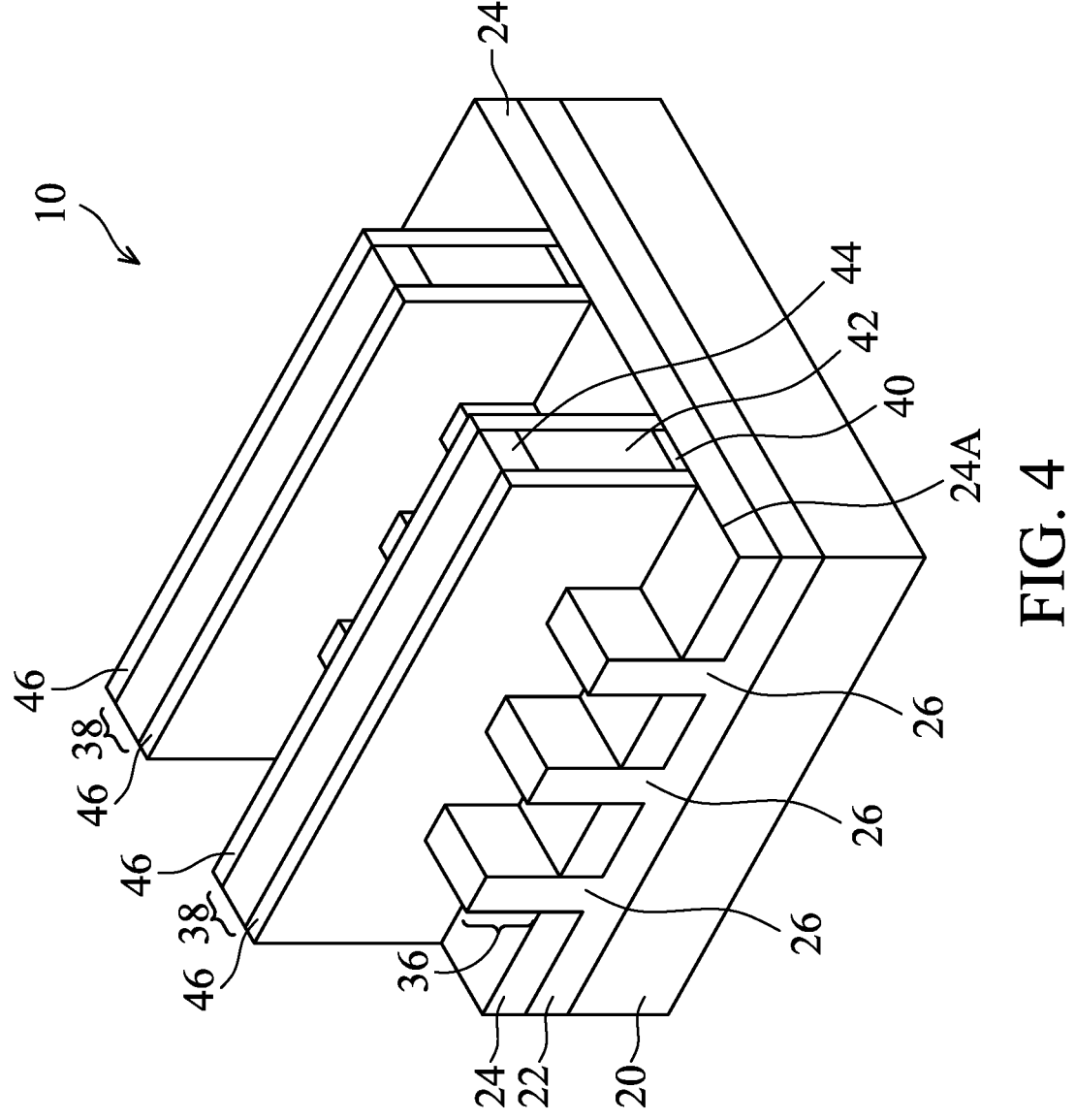

Referring to FIG. 4, dummy gate stacks 38 are formed to extend on the top surfaces and the sidewalls of (protruding) fins 36. The respective process is illustrated as process 408 in the process flow 400 shown in FIG. 25. Dummy gate stacks 38 may include dummy gate dielectrics 40 and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 408 in the process flow 400 shown in FIG. 25. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
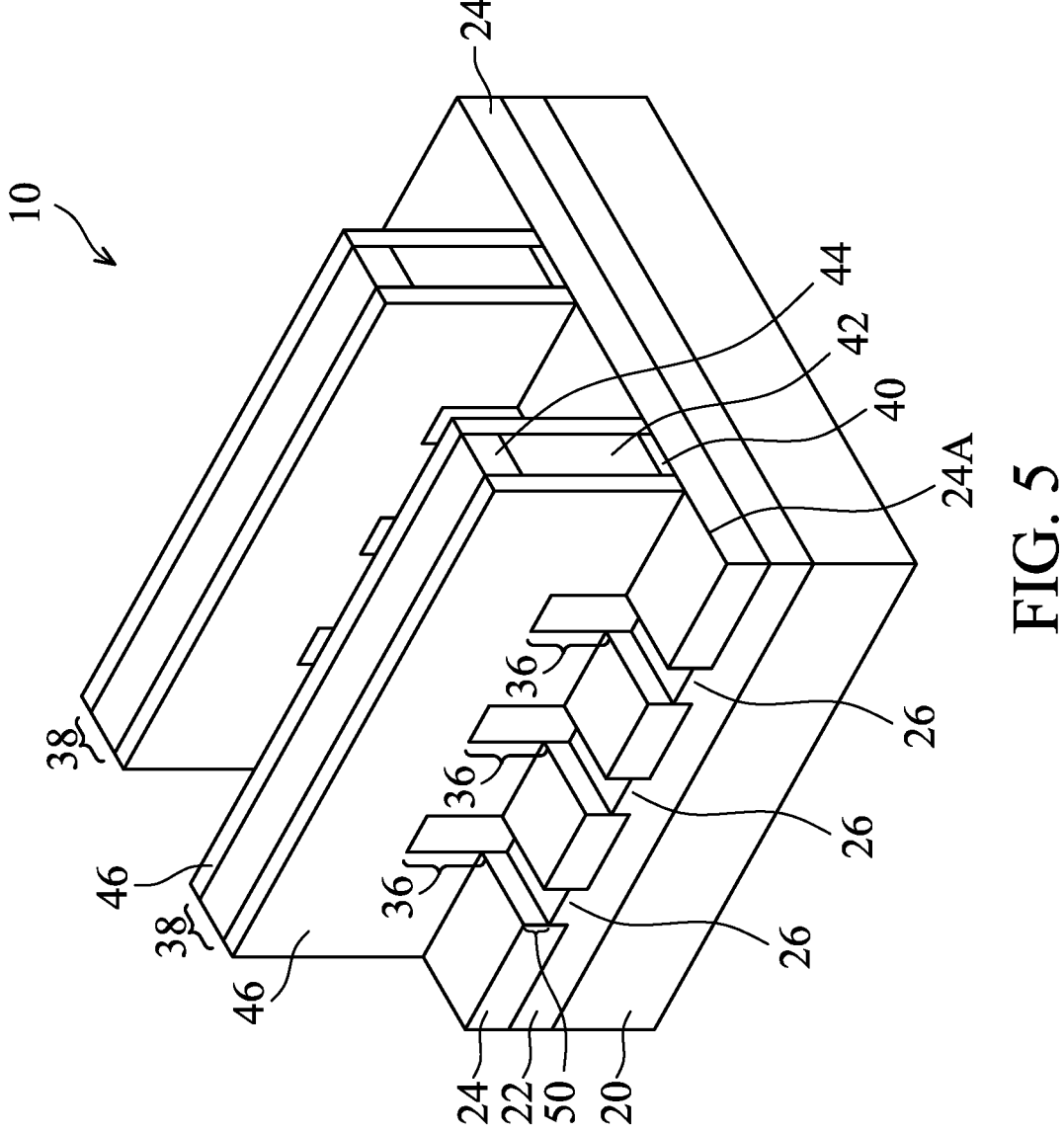

An etching process is then performed to etch the portions of protruding fins 36 that are not covered by dummy gate stacks 38 and gate spacers 46, resulting in the structure shown in FIG. 5. The respective process is illustrated as process 410 in the process flow 400 shown in FIG. 25. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between the remaining portions of protruding fins 36.

Figure 6:
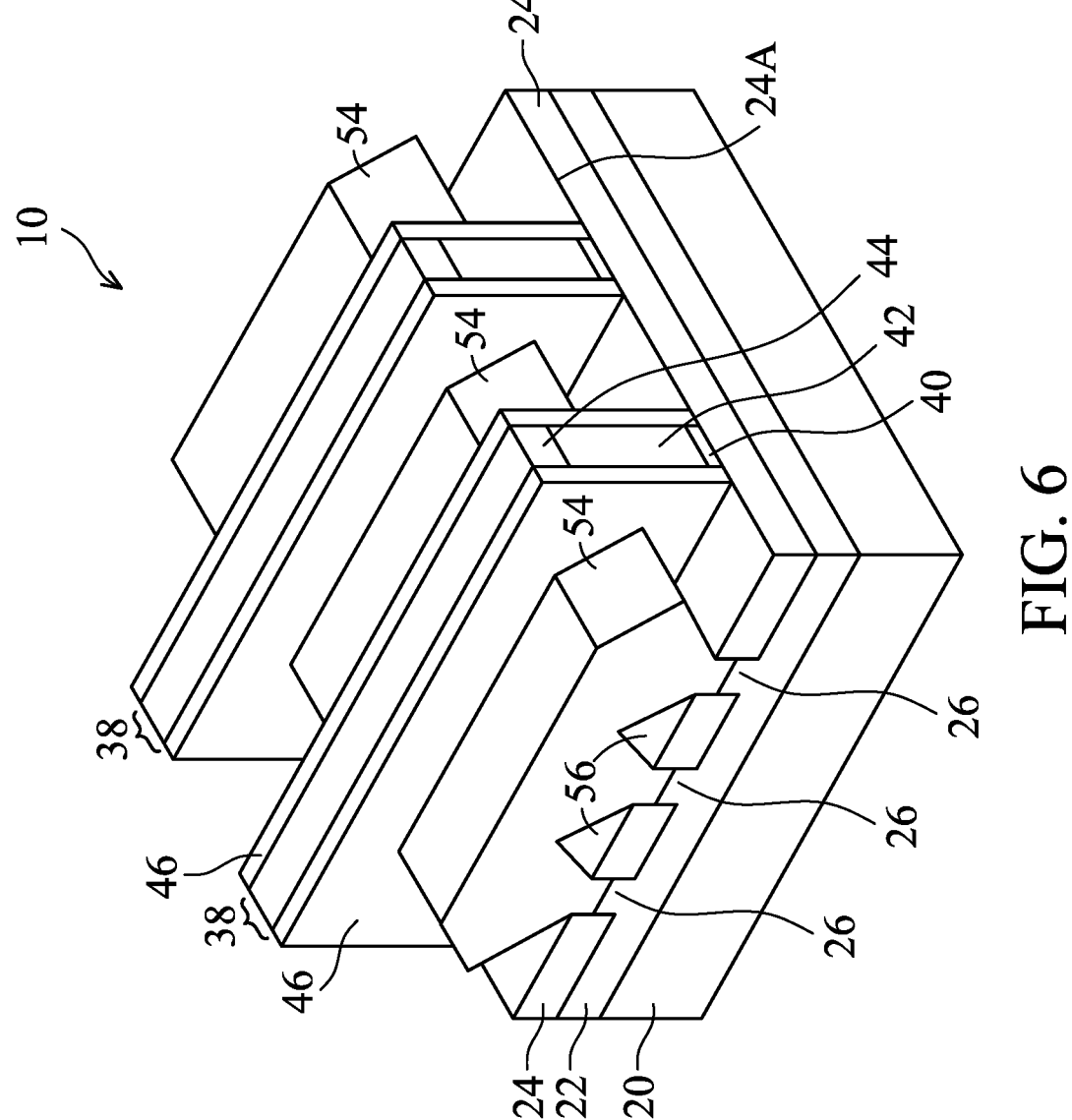

Next, epitaxy regions (source/drain regions) 54 are formed by selectively growing (through epitaxy) a semiconductor material in recesses 50, resulting in the structure in FIG. 6. The respective process is illustrated as process 412 in the process flow 400 shown in FIG. 25. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated. In accordance with some embodiments of the present disclosure, the formation of epitaxy regions 54 may be finished when the top surface of epitaxy regions 54 is still wavy, or when the top surface of the merged epitaxy regions 54 has become planar, which is achieved by further growing on the epitaxy regions 54 as shown in FIG. 6.

After the epitaxy process, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 7A:
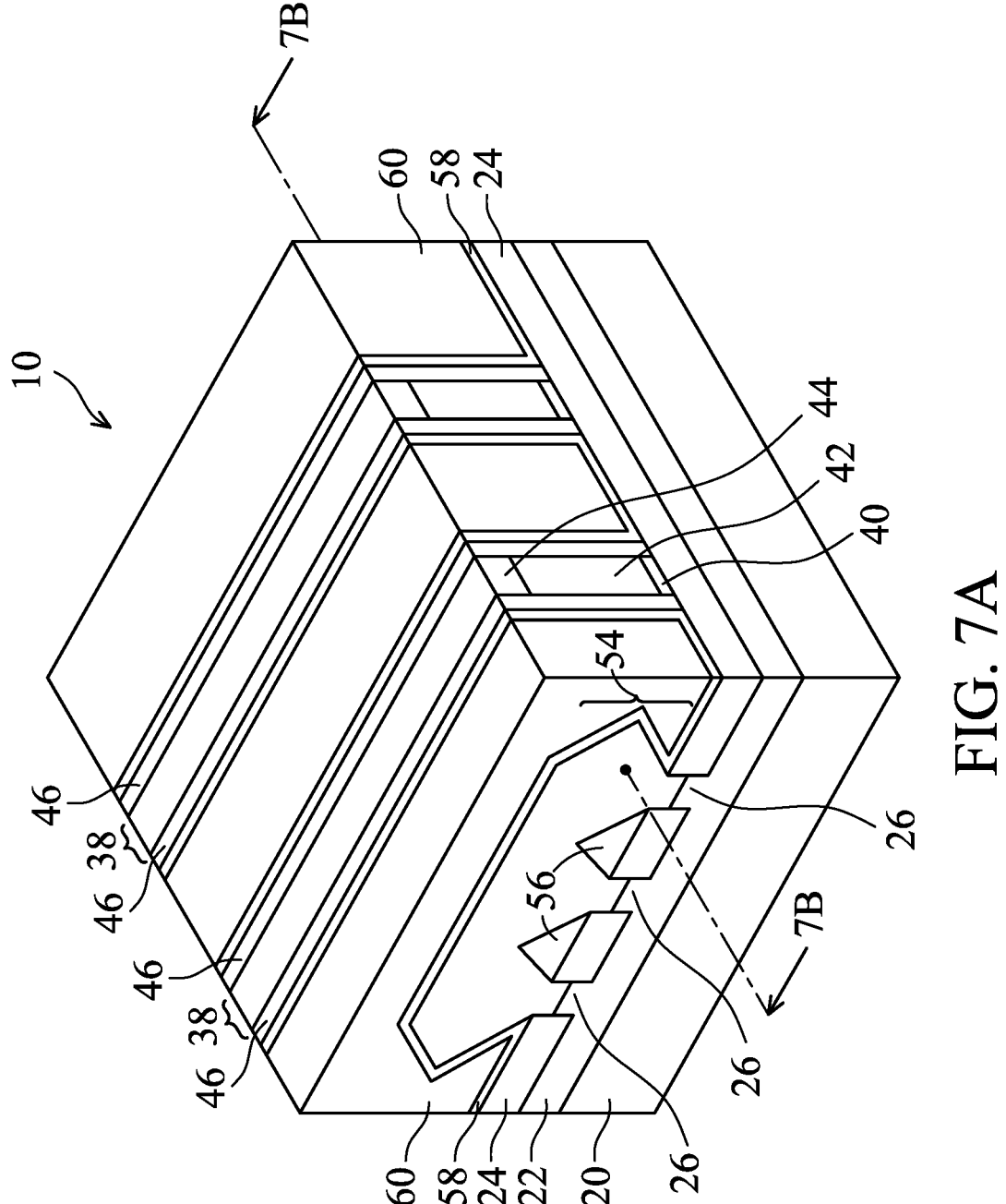

FIG. 7A illustrates a perspective view of the structure after the formation of Contact Etch Stop Layer (CESL) 58 and Inter-Layer Dielectric (ILD) 60. The respective process is illustrated as process 414 in the process flow 400 shown in FIG. 25. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
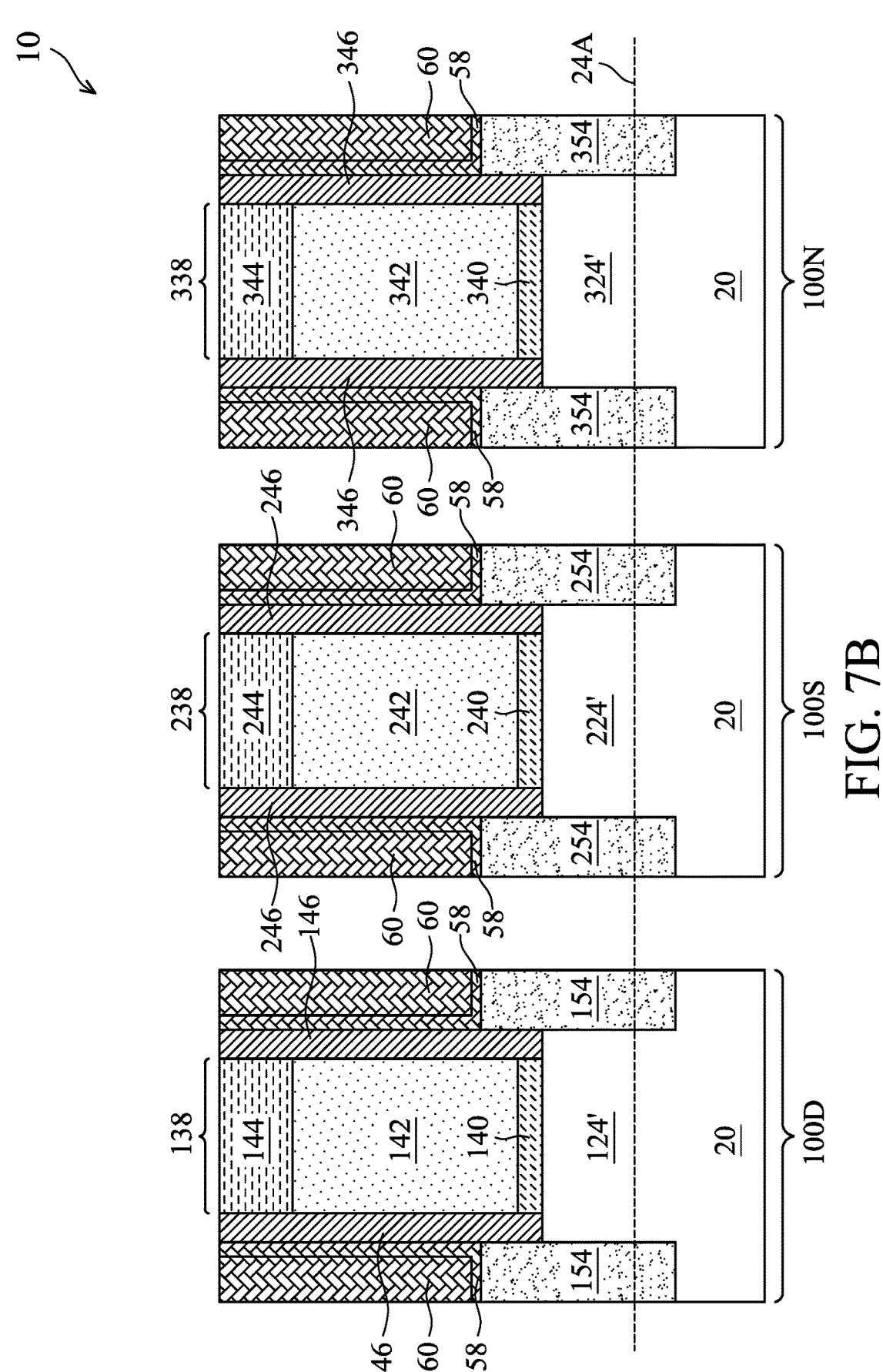

FIG. 7B illustrates the cross-sectional views of an intermediate structure in the formation of a first FinFET, a second FinFET, and a third FinFET (198, 298 and 398 in FIG. 20A) on the same substrate 20. It is appreciated that FinFETs are examples, and other types of transistors such as nano-sheet transistors, nano-wire transistors, planar transistors, gate-all-around transistors, or the like, may also be formed by applying the concept of the present disclosure. In accordance with some embodiments, the first FinFET, the second Fin-FET, and the third FinFET are formed in device regions 100D, 100S, and 100N, respectively, wherein the letter "D" represents "double doping-metal-containing layer", the letter "S" represents "single doping-metal-containing layer," and the letter "N" represents "No doping-metal-containing layer". In accordance with some embodiments, the three FinFETs are n-type FinFETs. In accordance with alternative embodiments, the three FinFETs are p-type FinFETs. In accordance with yet other embodiments, the three FinFET includes the mixture of the n-type FinFET(s) and p-type FinFET(s) in any combination. The three FinFETs may have the same size, same stack of layers, or the like, or may be different from each other, for example, with different channel lengths, different stack of layers, or the like. For example, the channel length of the first FinFET may be smaller than or greater than the channel length of the either one of the second FinFET and the third FinFET. The cross-sectional view of either one of the first FinFET, the second FinFET, and the third FinFET may correspond to the cross-sectional view obtained from the vertical plane containing line 7B-7B in FIG. 7A.

To distinguish the features in the first FinFET, the second FinFET, and the third FinFET, the features in the first FinFET in FIG. 7B may be represented using the reference numerals of the corresponding features in FIG. 7A plus number 100, and the features in the second FinFET in FIG. 7B may be represented using the reference numerals of the corresponding features in FIG. 7A plus number 200. Similarly, the features in the third FinFET in FIG. 7B may be represented using the reference numerals of the corresponding features in FIG. 7A plus number 300. For example, the source/drain regions 154, 254, and 354 in FIG. 7B correspond to source/drain regions 54 in FIG. 7A, and the gate spacers 146, 246, and 346 in FIG. 7B correspond to the gate spacers 46 in FIG. 7A. The corresponding features in the first FinFET, the second FinFET, and the third FinFET may be formed in common processes, with some of the example processes discussed in subsequent paragraphs, or may be formed in separate processes.

After the structure shown in FIGS. 7A and 7B is formed, the dummy gate stacks 138, 238, and 338 in FIG. 7B are replaced with metal gates and replacement gate dielectrics, as shown in FIGS. 8A, 8B, and 9-19. In these figures, the top surfaces 24A of STI regions 24 are illustrated, and semiconductor fins 124', 224' and 324' protrude higher than top surfaces 24A of the respective adjacent STI regions 24.

Figure 8A:
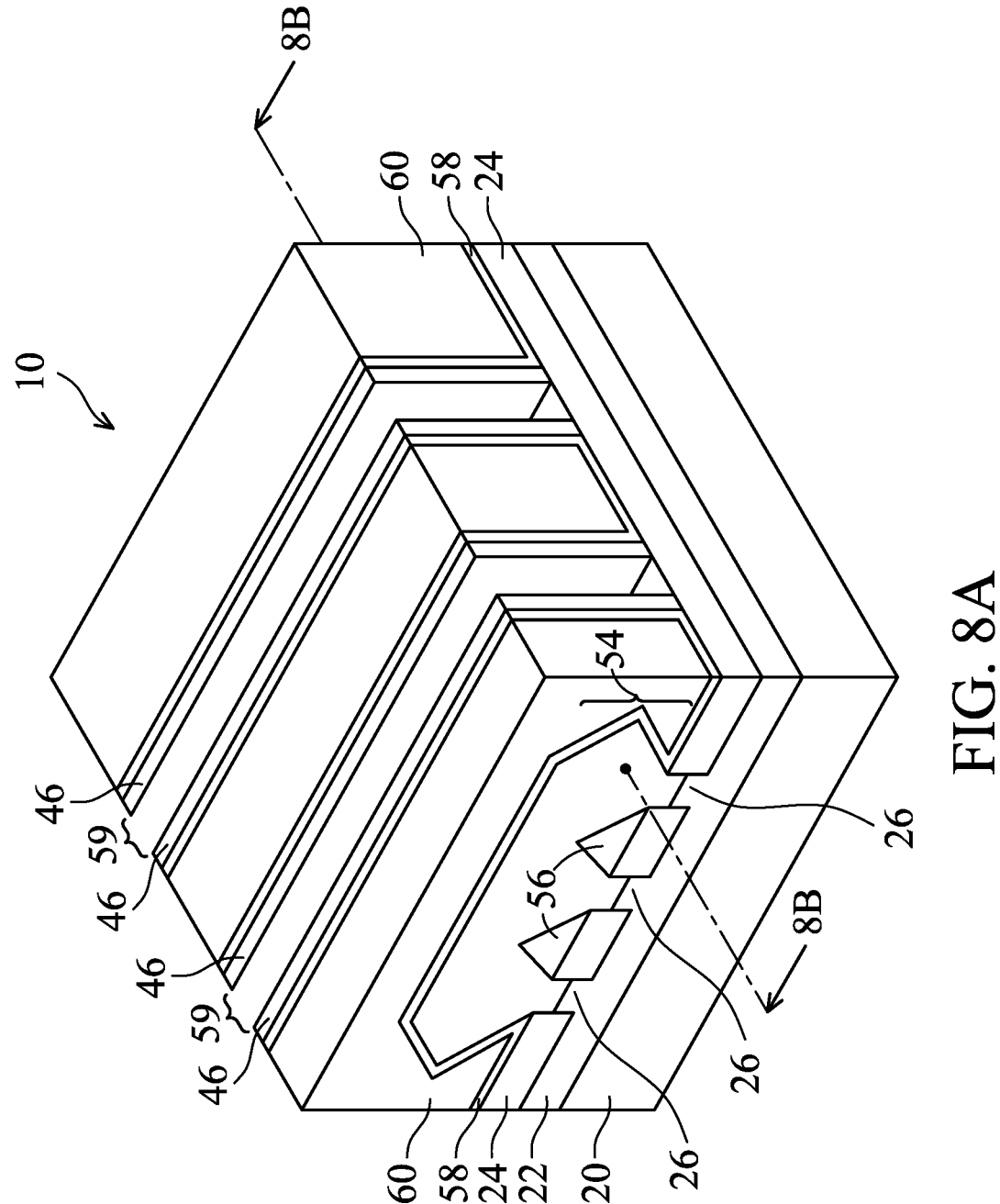
Figure 8B:
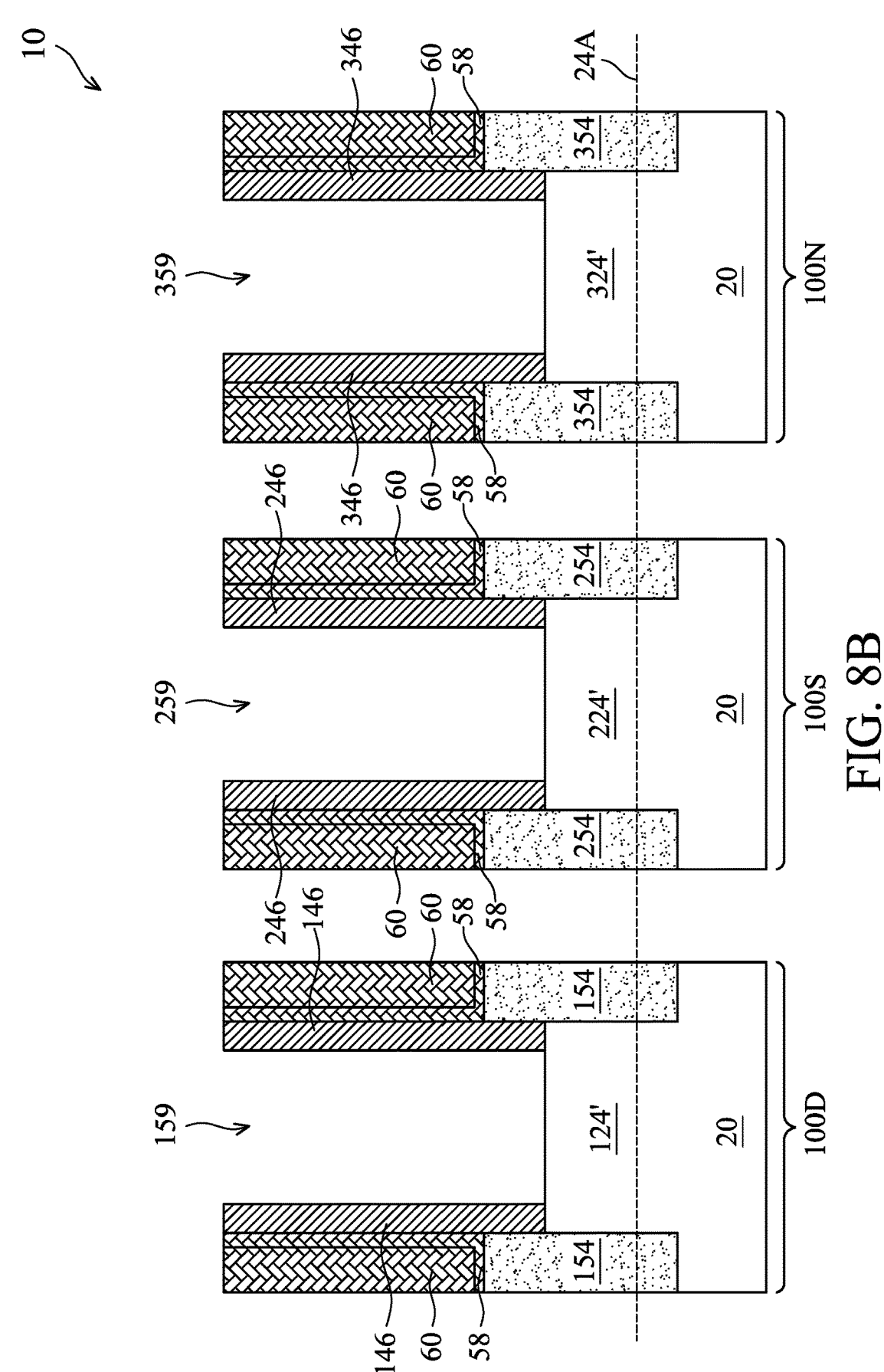

To form the replacement gates, hard mask layers 144, 244, and 344, dummy gate electrodes 142, 242, and 342, and dummy gate dielectrics 140, 240, and 340 as shown in FIGS. 7A and 7B are removed first, forming trenches 59 as shown in FIG. 8A. The respective process is illustrated as process 416 in the process flow 400 shown in FIG. 25. Trenches 59 in FIG. 8A correspond to trench 159 in device region 100D, trench 259 in device region 100S, and trench 359 in device region 100N in FIG. 8B. The top surfaces and the sidewalls of protruding fins 124', 224' and 324' are exposed to trenches 159, 259, and 359, respectively.

Figure 9:
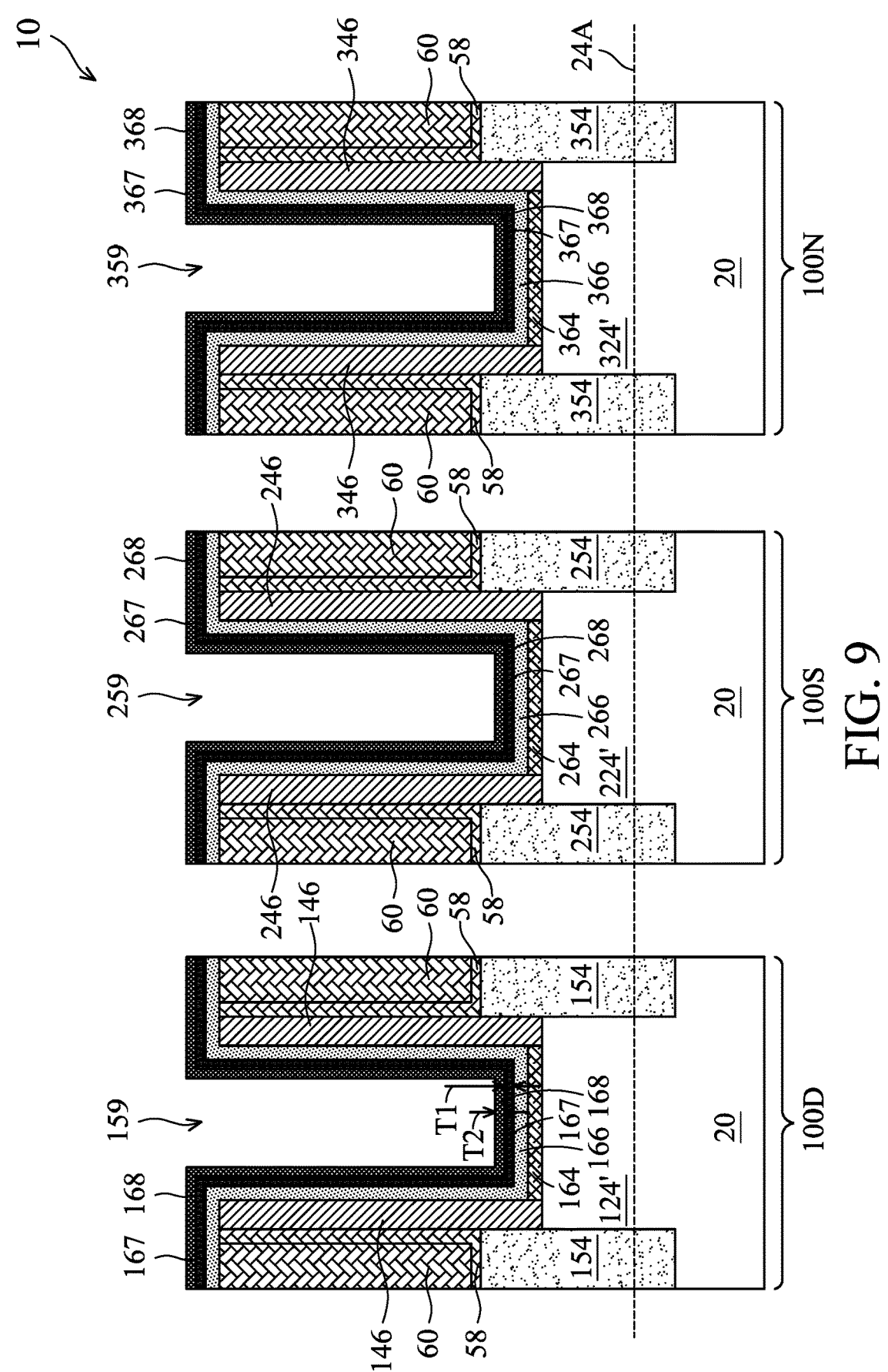

Next, referring to FIG. 9, gate dielectrics 164/166, 264/266, and 364/366 are formed, which extend into trenches 159, 259, and 359, respectively. The respective process is illustrated as process 418 in the process flow 400 shown in FIG. 25. In accordance with some embodiments of the present disclosure, the gate dielectrics include Interfacial Layers (ILs) 164, 264, and 364, which are formed on the exposed surfaces of protruding fins 124', 224', and 324', respectively. Each of ILs 164, 264, and 364 may include an oxide layer such as a silicon oxide layer, which is formed through the thermal oxidation of protruding fins 124', 224', and 324', a chemical oxidation process, or a deposition process. The gate dielectrics may also include high-k dielectric layers 166, 266, and 366 over the corresponding ILs 164, 264, and 364. Each of high-k dielectric layers 166, 266, and 366 may be formed of a non-lanthanum containing high-k dielectric material such as hafnium oxide, aluminum oxide, zirconium oxide, or the like, and may be formed simultaneously in common processes or in separate processes. The dielectric constant (k-value) of the high-k dielectric material is higher than 3.9, and may be higher than about 7.0. High-k dielectric layers 166, 266, and 366 may be free from, or may include, the doping metal (such as lanthanum) that is to be doped in subsequent process. High-k dielectric layers 166, 266, and 366 are overlying, and may contact, the respective underlying ILs 164, 264, and 364. High-k dielectric layers 166, 266, and 366 are formed as conformal layers, and extend on the sidewalls of protruding fins 124', 224', and 324' and the top surface and the sidewalls of gate spacers 146, 246, and 346, respectively. In accordance with some embodiments of the present disclosure, high-k dielectric layers 166, 266, and 366 are formed using ALD or CVD. High-k dielectric layers 166, 266, and 366 may be portions of the same dielectric layer, and are formed simultaneously using the same material and having the same thickness, or separately with different materials and/or different thicknesses.

FIG. 9 further illustrates the formation of first doping-metal-containing layers 167, 267, and 367, which may be formed in a common deposition process or separate deposition processes. The respective process is illustrated as process 420 in the process flow 400 shown in FIG. 25. Doping-metal-containing layers 167, 267, and 367 comprise a metal, which, when doped into the underlying high-k dielectric layers 166, 266, and/or 366, may cause the change (tuning) of the threshold voltages of the corresponding FinFETs. In accordance with some embodiments, doping-metal-containing layers 167, 267, and 367 comprise lanthanum, which may be in the form of lanthanum oxide ($La_2O_3$), for example. Other metals or elements such as Al, Y, Hf, or the like, or alloys thereof may also be adopted to form doping-metal-containing layers 167, 267, and 367, which metals or elements may also cause the tuning of threshold voltages. Doping-metal-containing layers 167, 267, and 367 may be formed using a conformal deposition method such as Atomic Layer Deposition (ALD), Chemical Vapor Deposition (CVD), or the like. The thickness T1 of doping-metal-containing layers 167, 267, and 367 may be in the range between about 0.5 Å and about 20 Å. It is realized that the thickness T1 of doping-metal-containing layers 167, 267, and 367 may generally be related to the magnitude of the intended threshold voltage tuning, and the greater threshold voltage tuning is intended, the greater thickness T1 is.

FIG. 9 further illustrates the formation of first hard masks 168, 268, and 368, which are formed in a common deposition process. The respective process is illustrated as process 422 in the process flow 400 shown in FIG. 25. In accordance with some embodiments, hard masks 168, 268, and 368 are single-layer hard masks or multi-layer hard masks. In accordance with some embodiments, hard masks 168, 268, and 368 include a metal oxide layer such as an aluminum oxide layer, and a metal nitride layer such as a titanium nitride layer over the metal oxide layer. Hard masks 168, 268, and 368 may be formed using a conformal deposition method such as ALD, CVD, or the like. The thickness T2 of hard masks 168, 268, and 368 may be in the range between about 5 Å and about 50 Å in accordance with some embodiments.

Figure 10:
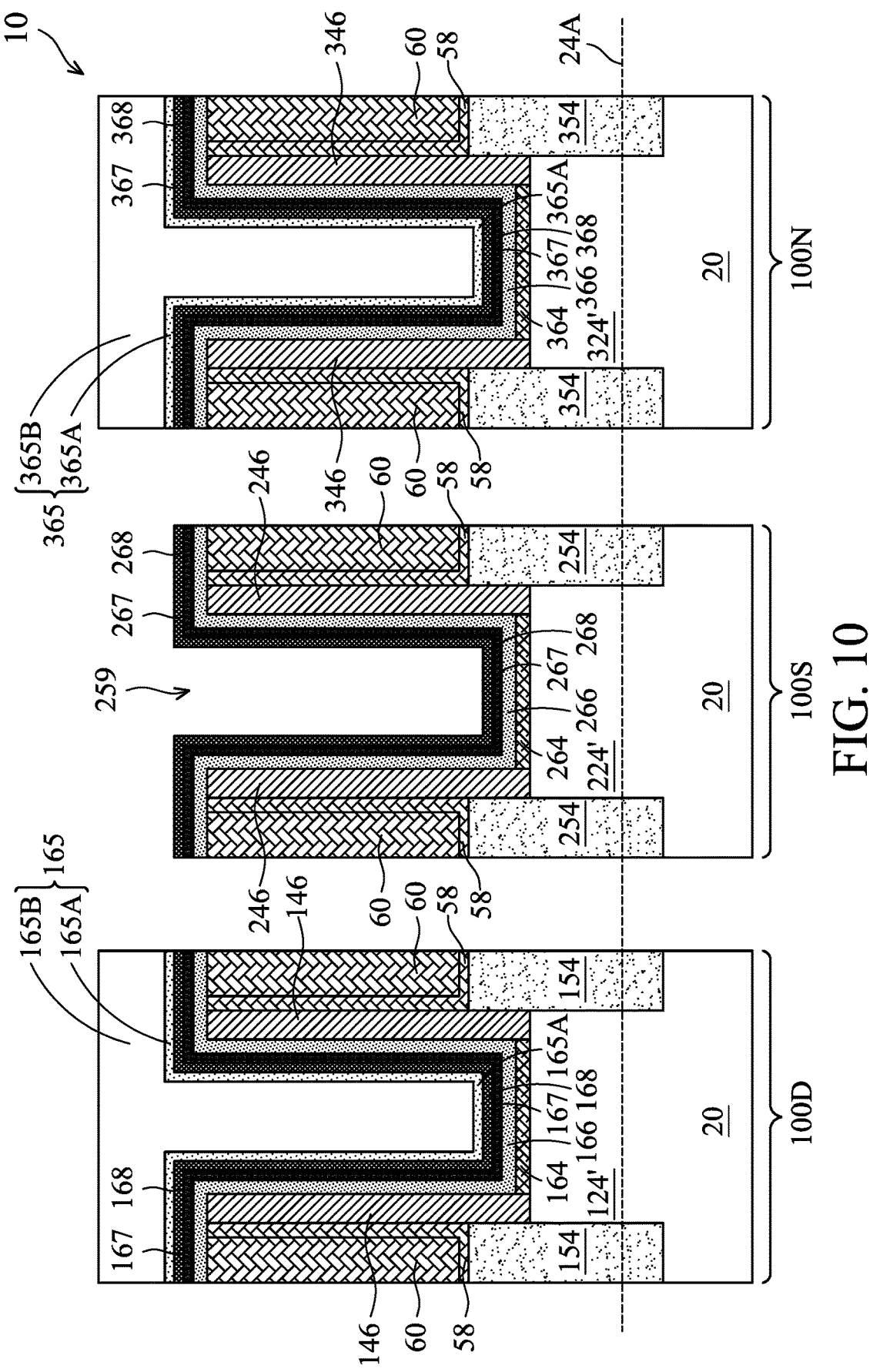
Figure 11:
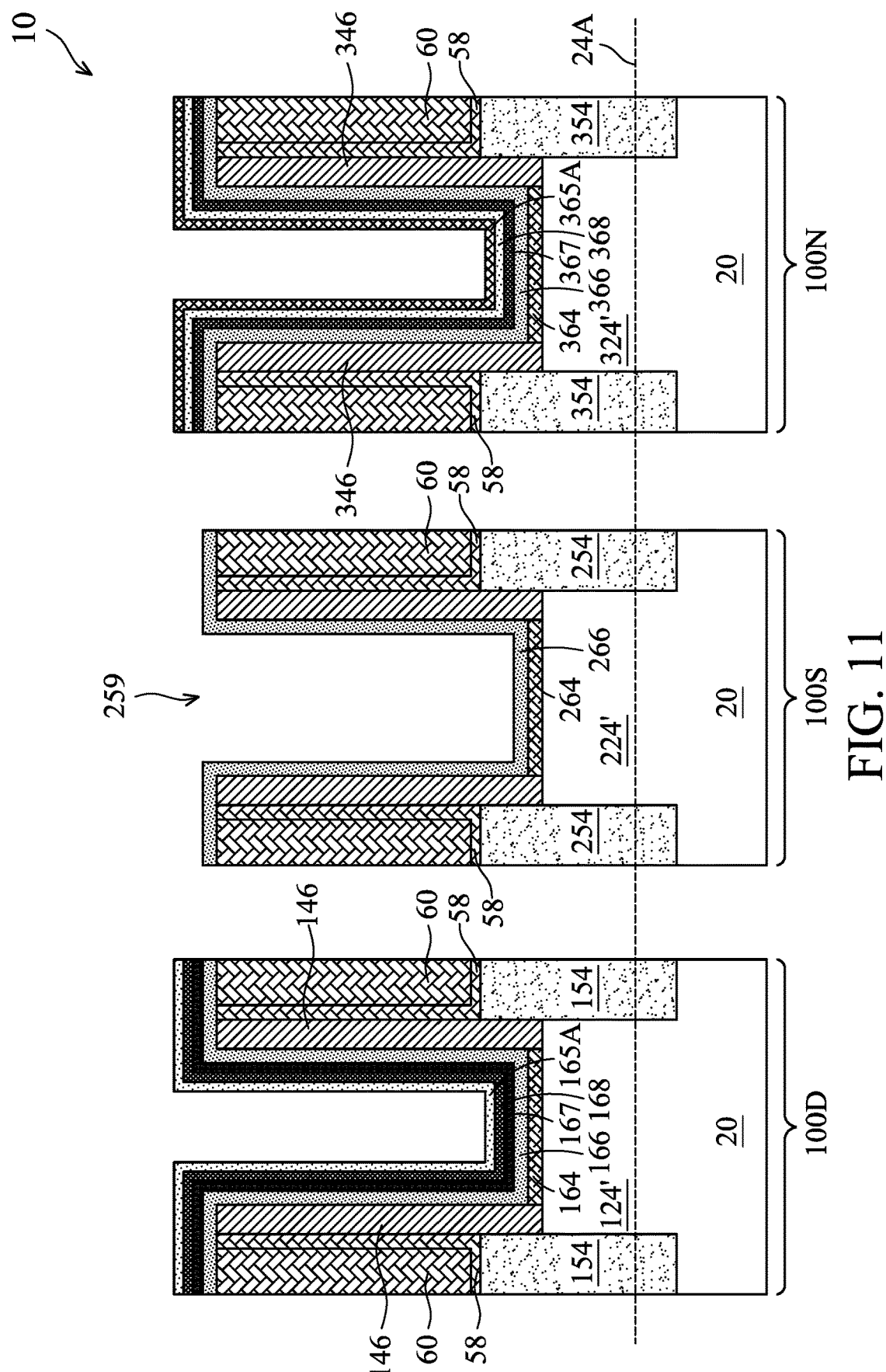

FIG. 10 illustrates the formation and the patterning of etching masks 165 and 365 in device regions 100D and 100N, respectively. Etching masks 165 and 365 may be formed to extend into device regions 100D, 100S, and 100N, and then removed from device region 100S in a patterning process. As a result, hard mask 268 is exposed, while hard masks 168 and 368 are covered by etching mask 165 and 365, respectively. In accordance with some embodiments, etching mask 165 includes Bottom Anti-Reflective Coating (BARC) 165A and photo resist 165B, and etching mask 365 includes BARC 365A and photo resist 365B. In an example formation process, the formation of BARCs 165A and 365A and photo resists 165B and 365B include forming a blanket BARC layer, and forming a photo resist on the blanket BARC layer. The photo resist is patterned using a lithography process to remove a portion from device region 100S. The blanket BARC layer is then etched using photo resists 165B and 365B as an etching mask. In accordance with some embodiments, the etching is performed using an etching gas comprising hydrogen (H2) and nitrogen (N2), wherein a bias voltage is applied. After the etching of blanket BARC layer, photo resists 165B and 365B are removed, and BARCs 165A and 365A are exposed, as shown in FIG. 11.

In accordance with alternative embodiments, etching masks 165 and 365 are formed of a single photo resist or a tri-layer, which includes a bottom layer, a middle layer over the bottom layer, and a top layer over the middle layer. In accordance with yet alternative embodiments, etching masks 165 and 365 are a single-photo-resist layer. The remaining photo resists 165B and 365B may be removed prior to or during the process shown in FIG. 11.

Next, hard mask 268 and doping-metal-containing layer 267 are removed in an etching process(es). The respective process is illustrated as process 424 in the process flow 400 shown in FIG. 25. The resulting structure is shown in FIG. 11. The etching may be performed through a wet etching process. For example, a wet etching chemical including the mixture of phosphoric acid and hydrogen peroxide, or the mixture of ammonium hydroxide, hydrochloric acid, hydrogen peroxide, carbonic acid and water, and the like may be used to etch hard mask 268 and doping-metal-containing layer 267. In accordance with alternative embodiments of the present disclosure, the etching is performed using a solution including ammonia dissolved in water ($NH_4OH$), carbonic acid, or the like. Hard masks 168 and 368 are protected by BARCs 165A and 365A, and will remain after the etching process. After the etching of hard mask 268, doping-metal-containing layer 267 is exposed.

The exposed doping-metal-containing layer 267 is then removed in an etching process, and high-k dielectric layer 266 is exposed after the etching process. In accordance with some embodiments of the present disclosure, the etching of doping-metal-containing layer 267 is performed through a wet etching process. In accordance with some embodiments, the same wet etching chemical for etching hard mask 268 may be used for etching doping-metal-containing layer 267. It is appreciated that the removal of both hard mask 268 and doping-metal-containing layer 267 is performed using the same etching masks 165 and 365 (BARCs 165A and 365A). Hard masks 168 and 368, although not used as etching masks for etching doping-metal-containing layer 267, has the function of controlling the etching width of doping-metal-containing layer 267 to prevent the over-etching of doping-metal-containing layer 267 in the lateral direction.

Figure 12:
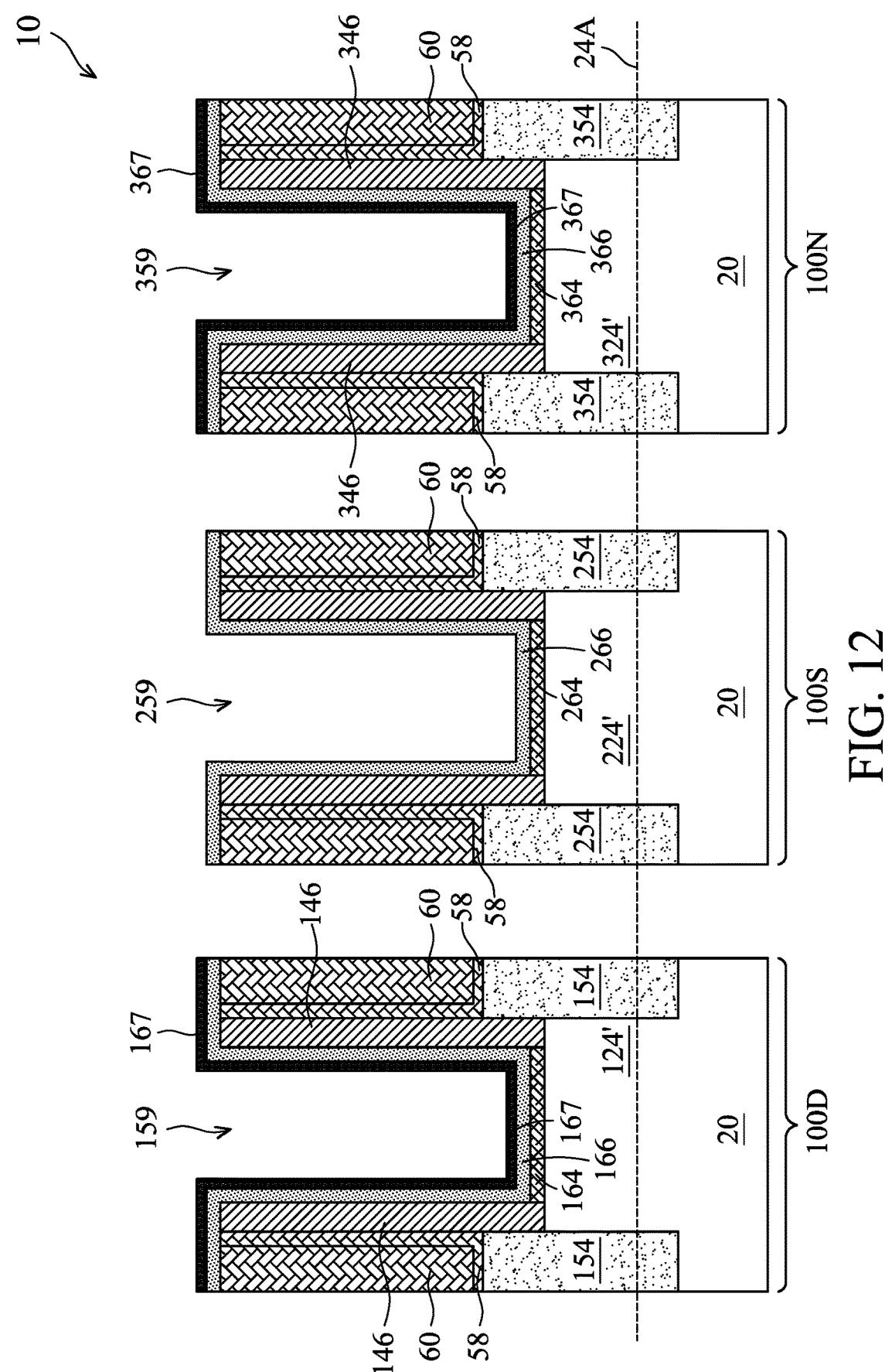

Next, BARCs 165A and 365A are removed. In accordance with some embodiments, etching masks 165A and 365A are removed through ashing, or removed using an etching gas comprising hydrogen ($H_2$) and nitrogen ($N_2$), wherein no bias voltage is applied. The resulting structure is shown in FIG. 12. Hard masks 168 and 368 are accordingly exposed. The remaining hard masks 168 and 368 are then removed. The respective process is illustrated as process 426 in the process flow 400 shown in FIG. 25. The etching chemical may include ammonium hydroxide, hydrogen peroxide, hydrochloric acid, carbonic acid, and the like.

Figure 13:
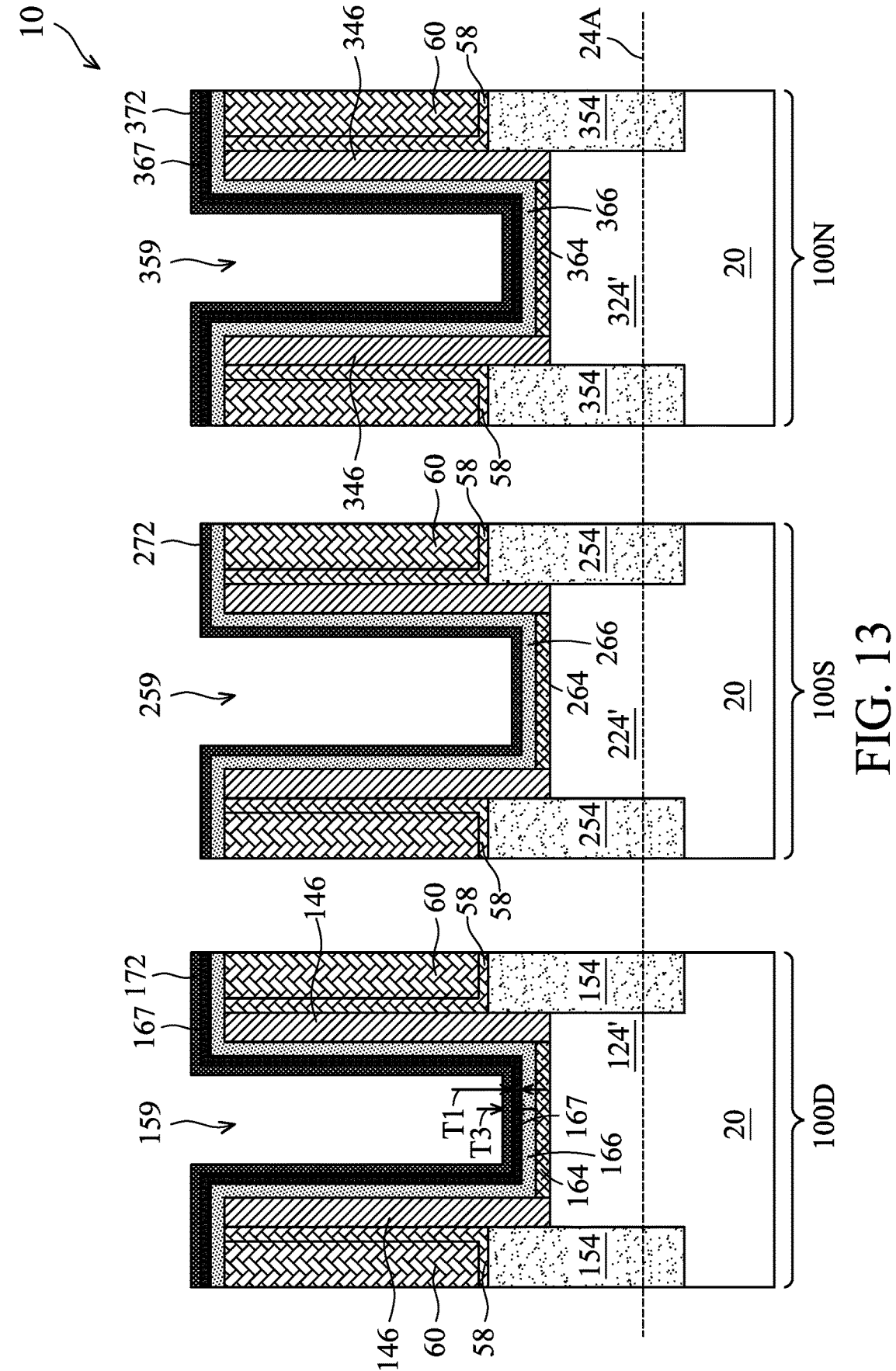

FIGS. 13 through 16 illustrate the formation of second doping-metal-containing layers 172 and 272 in device regions 100D and 100S, respectively. Referring to FIG. 13, doping-metal-containing layers 172, 272, and 372 are formed, for example, in a deposition process. The respective process is illustrated as process 428 in the process flow 400 shown in FIG. 25. The material of doping-metal-containing layers 172, 272, and 372 may be similar to that of doping-metal-containing layer 167. The thickness T3 of doping-metal-containing layers 172, 272, and 372 may be in the range between about 0.5 Å and about 20 Å. Depending on the intended magnitude of tuning in threshold voltages of the transistors in device regions 100D and 100S, thickness T3 may be greater than, equal to, or smaller than, thickness T1 of doping-metal-containing layer 167. For example, thickness ratio T1/T3 may be in the range between about 0.1 and 1, or in the range between about 0.3 and 0.7 when doping-metal-containing layers 172 is thicker than doping-metal-containing layers 167. Alternatively, thickness ratio T3/T1 may be in the range between about 0.3 and 1, or in the range between about 0.1 and 0.7 when doping-metal-containing layers 172 is thinner than doping-metal-containing layers 167.

Figure 14:
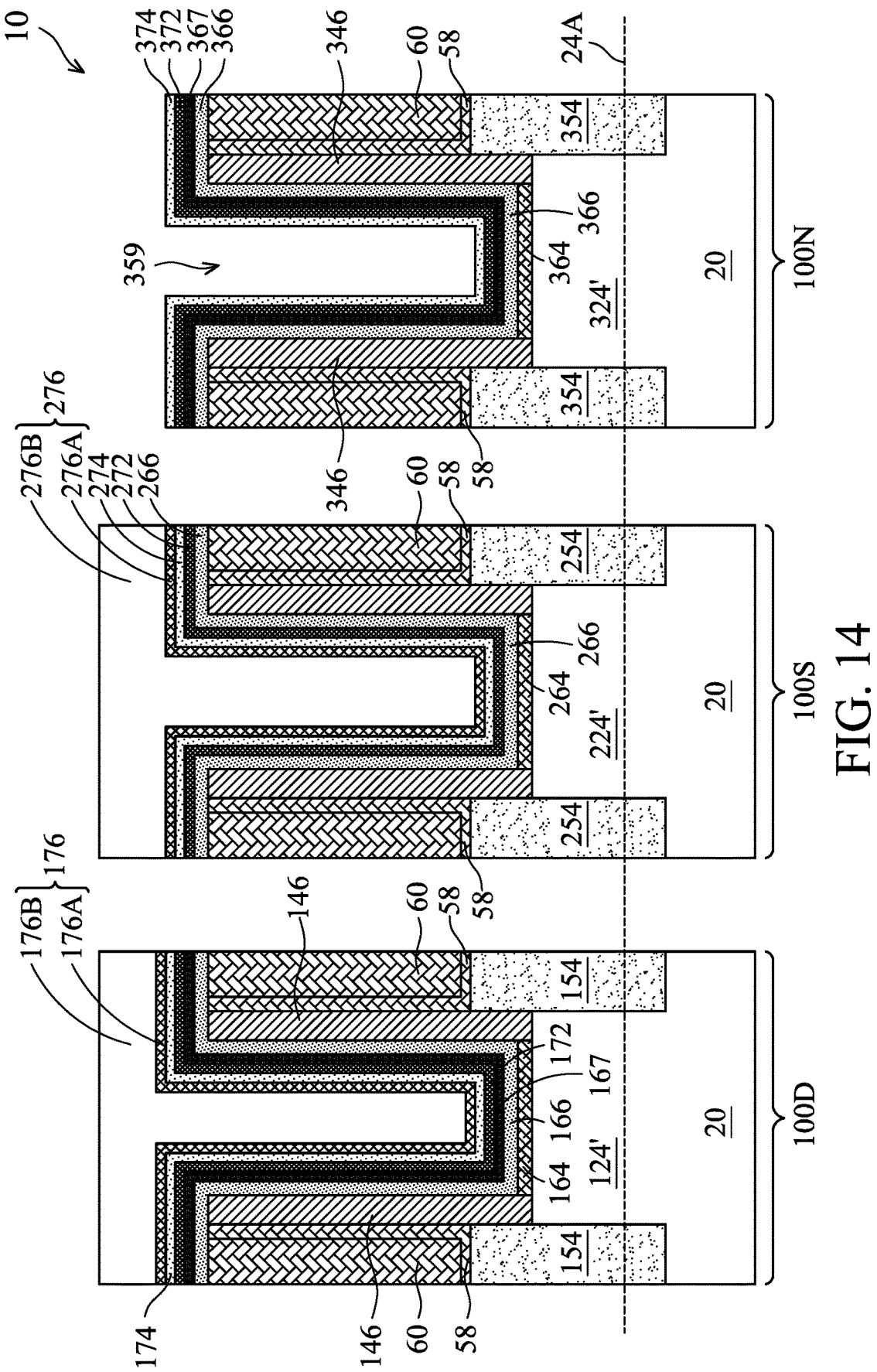

FIG. 14 further illustrates the formation of second hard masks 174, 274, and 374, which are formed in a common deposition process. The respective process is illustrated as process 430 in the process flow 400 shown in FIG. 25. The material, the structure, and the formation method of hard masks 174, 274, and 374 may be selected from the same group of candidate materials, structures, and formation methods of hard masks 168, 268, and 368 (FIG. 9). The thickness of hard masks 174, 274, and 374 may be in the range between about 5 Å and about 50 Å.

FIG. 14 also illustrates the formation and the patterning of etching masks 176 and 276 in device regions 100D and 100S, respectively. Etching masks 176 and 276 may be formed to extend into device regions 100D, 100S, and 100D, and then removed from device region 100N in a patterning process. Etching mask 176 may include BARC 176A, and photo resist 176B over BARC 176A. Etching mask 276 may include BARC 276A, and photo resist 276B over BARC 276A. As a result, hard mask 374 is exposed, while hard masks 174 and 274 are covered by etching masks 176 and 276, respectively. The material(s), the structure, and the formation process of etching masks 176 and 276 may be similar to the corresponding material(s), the structure, and the formation process of etching masks 165 and 365 (FIG. 10), and the details are not repeated herein.

Figure 15:
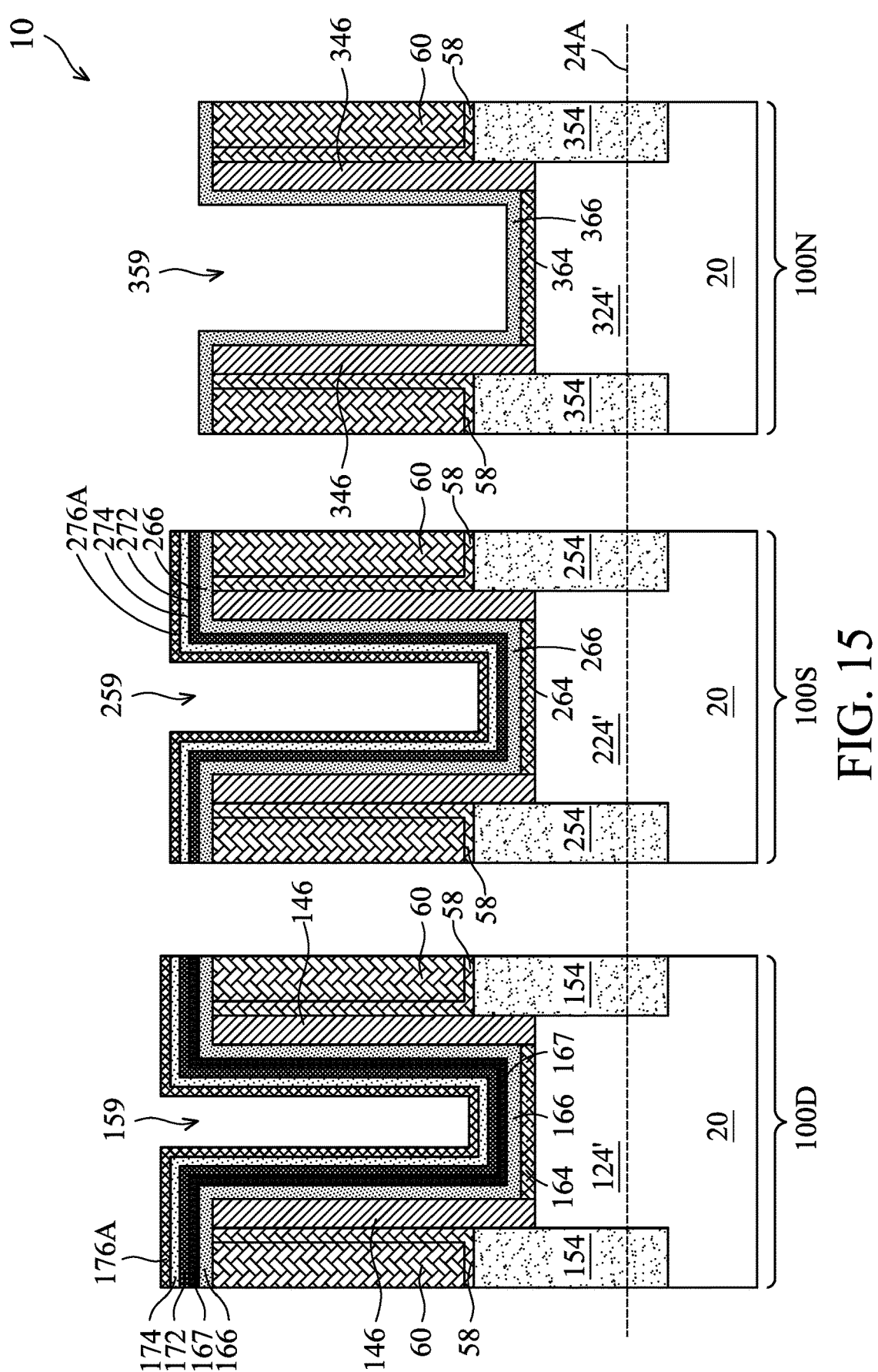

In subsequent processes, photo resists 176B and 276B may be removed. BARCs 176A and 276A are used as an etching mask to etch and remove hard mask 374 and doping-metal-containing layers 372 and 367. The respective process is illustrated as process 432 in the process flow 400 shown in FIG. 25. The resulting structure is shown in FIG. 15. The etching of hard mask 374 and doping-metal-containing layers 372 and 367 may be similar to the etching of hard mask 268 and doping-metal-containing layer 267 (FIG. 10), respectively, and the details are not discussed.

Figure 16:
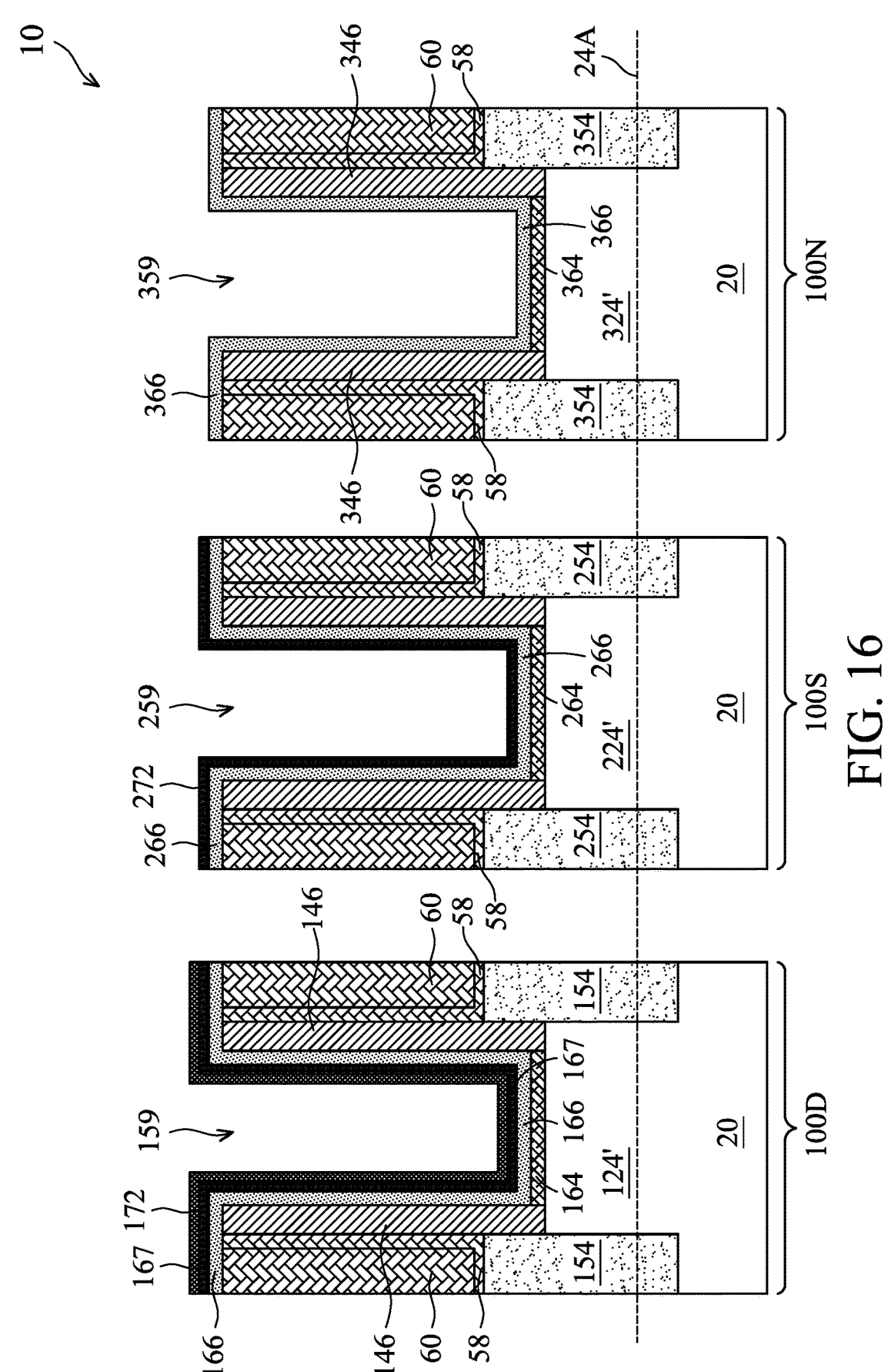

As shown in the preceding patterning processes, doping-metal-containing layer 367 is etched in the same process for etching doping-metal-containing layer 372 (FIG. 15), rather than in the same process for etching doping-metal-containing layer 267 (FIG. 11). This has the advantageous feature of exposing high-k dielectric layer 366 once, rather than twice, to the etching chemicals. This will reduce the loss in high-k dielectric layer 366 caused by the over-etching of the doping-metal-containing layers. High-k dielectric layer 366 is thus exposed, as shown in FIG. 15. Next, BARCs 176A and 276A are removed using similar methods as removing BARCs 165A and 365A (FIG. 11). Hard masks 174 and 274 are also removed, similar to the removal of hard masks 168 and 368 (FIG. 11). The respective process is illustrated as process 434 in the process flow 400 shown in FIG. 25. The resulting structure is shown in FIG. 16.

Figure 17:
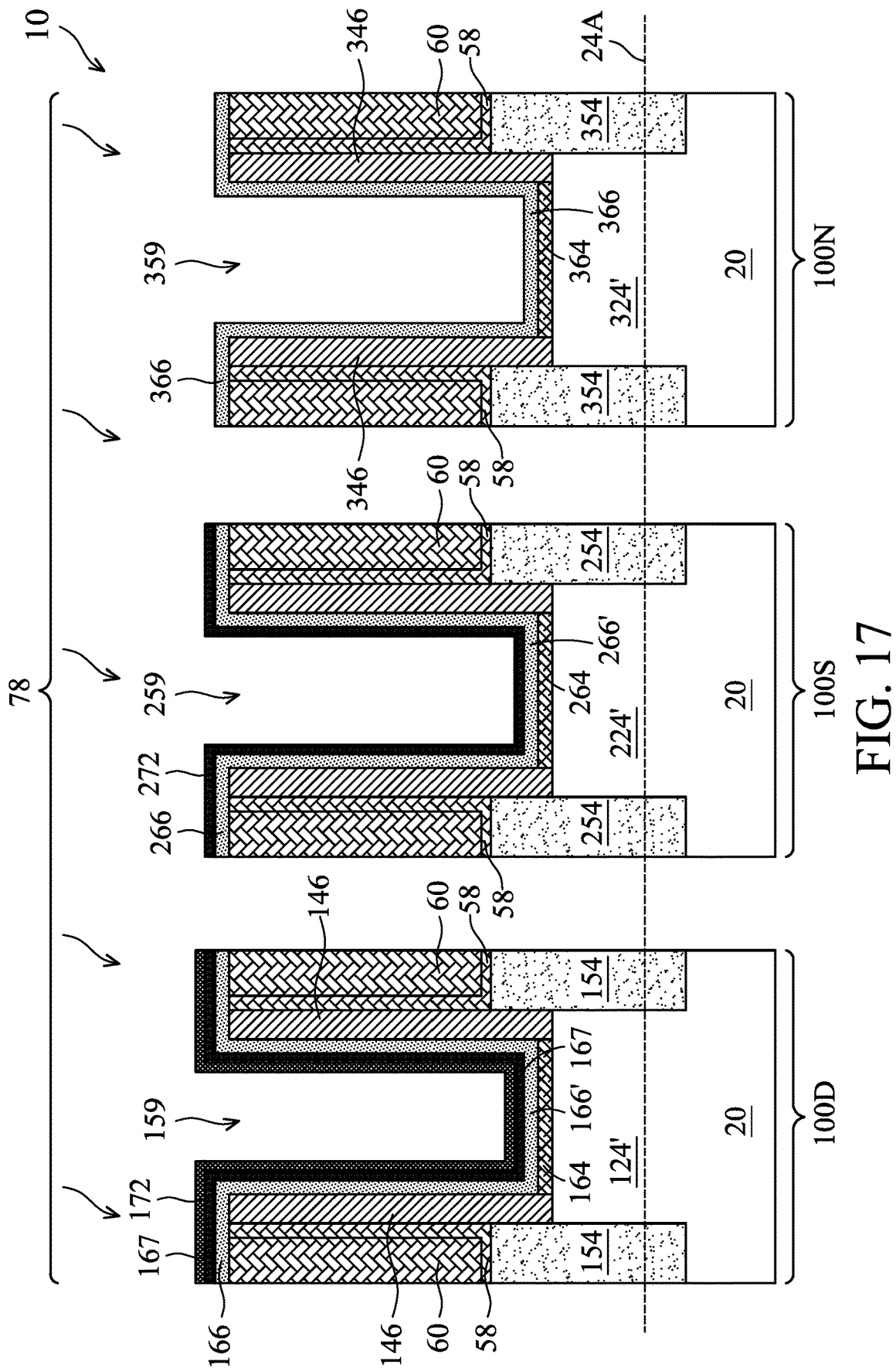

Referring to FIG. 17, a drive-in anneal process (represented as arrows 78) is performed. The respective process is illustrated as process 436 in the process flow 400 shown in FIG. 25. In accordance with some embodiments, the anneal process is performed using spike anneal, rapid thermal anneal, flash anneal, or the like. The anneal time and the anneal temperature are controlled to optimize the end result, for example, to ensure that the doping metal in the doping-metal-containing layers 167, 172, and 272 are diffused into high-k dielectric layers 166 and 266. Accordingly, the peak doping-metal atomic percentages are in the doping-metal-containing layers 167, 172, and 272, and reduce to lower values when closer to the interfaces. The corresponding doping-metal atomic percentage is shown by line 65 in FIG. 24. In accordance with some embodiments, the anneal duration may be in the range between about 0.1 seconds and about 60 seconds. The anneal temperature may be in the range between about 500° C. and about 1,000° C.

As a result of the drive-in anneal process, the doping metal (for example, lanthanum) is driven into high-k dielectric layers 166 and 266, resulting in the tuning of the threshold voltage of the resulting transistors in device regions 100D and 100S. For example, when lanthanum is doped into high-k dielectric layers 166 and 266 and when the resulting FinFETs are n-type FinFETs, the threshold voltages of the FinFETs in device regions 100D and 100S are reduced. Conversely, when lanthanum is doped into high-k dielectric layers 166 and 266 and when the resulting Fin-FETs are p-type FinFETs, the threshold voltages of the FinFETs in device regions 100D and 100S are increased. The high-k dielectric layers 166 and 266, with the doping metal added, are referred to as high-k dielectric layers 166' and 266', respectively.

The magnitude of the tuning is related to the amount (the atomic percentage) of the doping metal added into the high-k dielectric layers 166' and 266'. In accordance with some embodiments of the present disclosure, the tuning magnitude ΔVtD in threshold voltage of the transistor in device region 100D may be in the range between about 20 mV and about 300 mV. The tuning magnitude ΔVtS in threshold voltage of the transistor in device region 100S may be in the range between about 10 mV and about 150 mV. The tuning magnitudes ΔVtD and ΔVtS are related to the amount of the doping metal diffused into the high-k dielectric layers 166' and 266', and the more doping metal is diffused, the greater the tuning magnitudes. The ratio ΔVtD/ΔVtS is greater than 1.0, and may be in the range between about 1.2 and about 6.0, for example, depending on the total thickness of doping-metal-containing layers 167 and 172, and the thickness of doping-metal-containing layer 272.

The doping atomic percentage DP1 of the doping metal (such as La) in high-k dielectric layer 166' is higher than the atomic percentage DP2 of the doping metal in high-k dielectric layer 266'. Throughout the description, when doping atomic percentage is referred to, unless specified otherwise, it includes both of the peak atomic percentage and the average percentage. For example, atomic percentage DP1 and DP2 include both of (or may be either of) the peak atomic percentages and the average atomic percentages. In accordance with some embodiments, the ratio DP1/DP2 may be greater than about 1.3, greater than about 2, and may be in the range between about 1.3 and 6.0, wherein DP1 and DP2 may be the peak doping atomic percentages of the doping metal in high-k dielectric layers 166' and 266', respectively. In accordance with some embodiments, the doping atomic percentage DP1 is greater than about 0.1%, and may be in the range between about 0.3% and about 30%, and the atomic percentage DP2 may be greater than about 0.1%, and may be in the range between about 0.1% and about 20%.

When the doping metal is driven into high-k dielectric layers 166' and 266' to tune the threshold voltages in the resulting FinFETs 198 and 298 (FIG. 20A) in device region 100D and 100S, respectively, the doping metal is not doped into high-k dielectric layer 366. Accordingly, the threshold voltage in the resulting FinFET 398 (FIG. 20A) in device region 100N is not tuned, and hence the tuning of the threshold voltage is selective. Furthermore, high-k dielectric layer 366 may be free from the doping metal if it does not comprise the doping metal when it is deposited. Alternatively, high-k dielectric layer 366 may comprise the doping metal when it comprises the doping metal as deposited. In these embodiments, however, the doping atomic percentage DP3 of the doping metal in high-k dielectric layer 366 is still lower than the doping atomic percentage DP2 in high-k dielectric layer 266', which is further lower than the doping atomic percentage DP1 in high-k dielectric layer 166'.

As a result of the formation of the doping-metal-containing layers, and through a common drive-in anneal process, the threshold voltage of the first FinFET may be tuned by a first value ΔVt1, the threshold voltage of the second FinFET may be tuned by a second value ΔVt2 smaller than the first value ΔVt1, and the threshold voltage of the third FinFET is not tuned. The three FinFETs may have identical structures except the different doping atomic percentages of the doping metal in the high-k dielectric layers. Through the threshold voltage tuning, their threshold voltages are distinguished from each other so that the three FinFETs may suit to the requirement of different circuits in the same device die.

Figure 18:
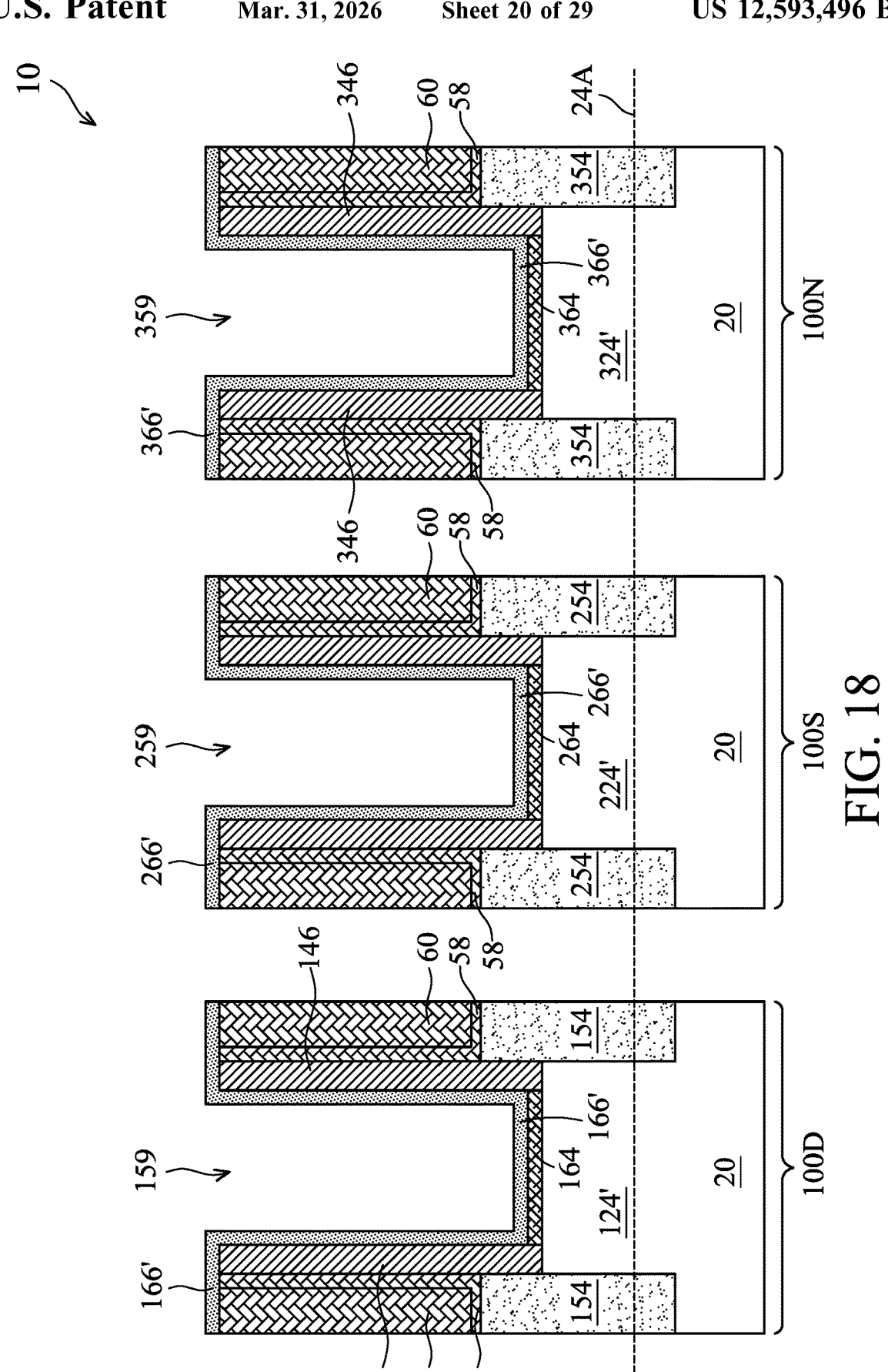

After the drive-in anneal process, the remaining doping-metal-containing layers 167, 172, and 272 are removed in an etching process. The respective process is illustrated as process 438 in the process flow 400 shown in FIG. 25. The resulting structure is shown in FIG. 18. In accordance with some embodiments of the present disclosure, the etching of doping-metal-containing layers 167, 172, and 272 is performed through a wet etching process. The etching chemical may include a chemical solution including ammonium hydroxide, hydrogen peroxide, hydrochloric acid, carbonic acid, or the like, or combinations thereof.

Figure 19:
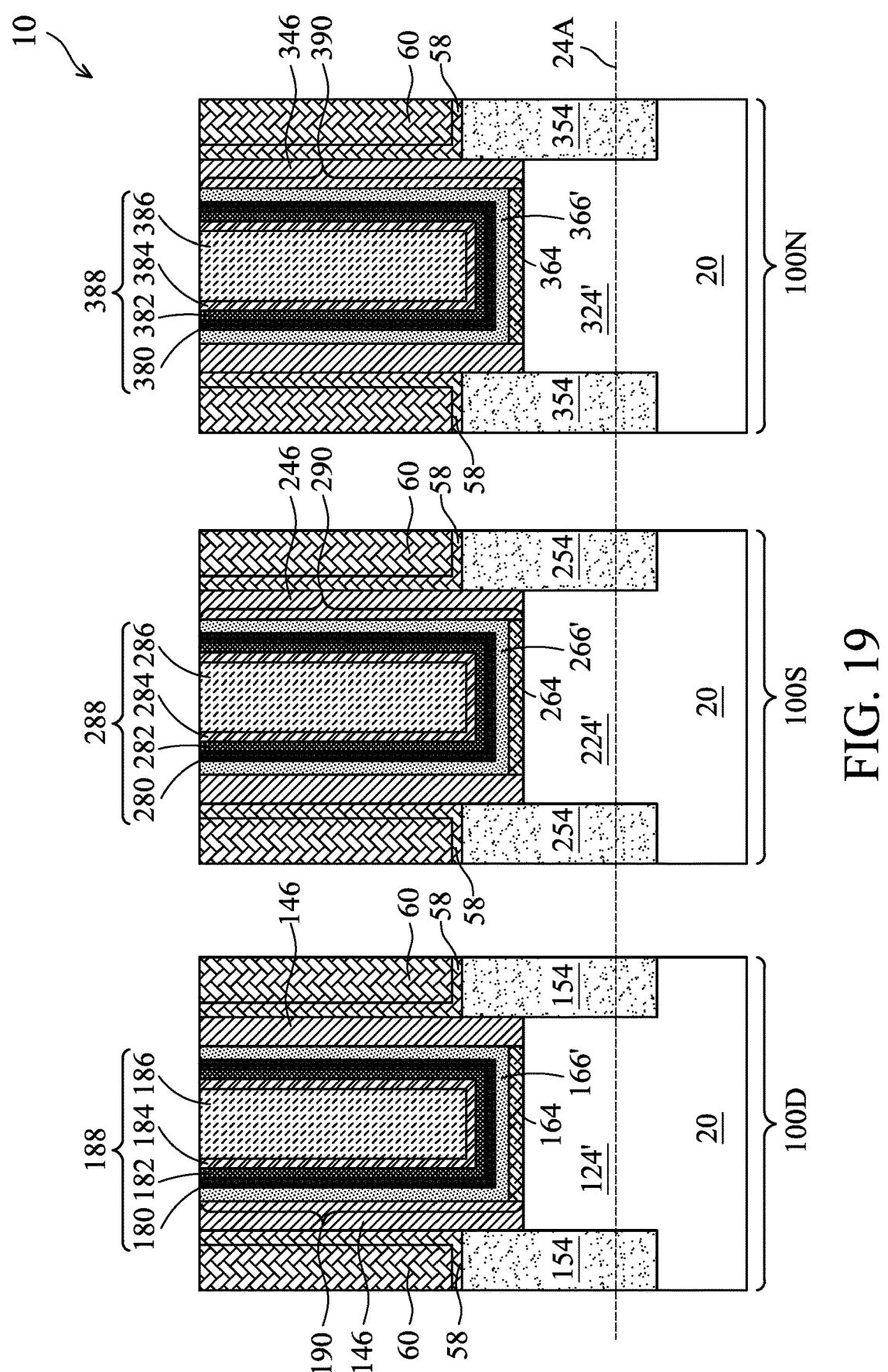
Figure 20A:
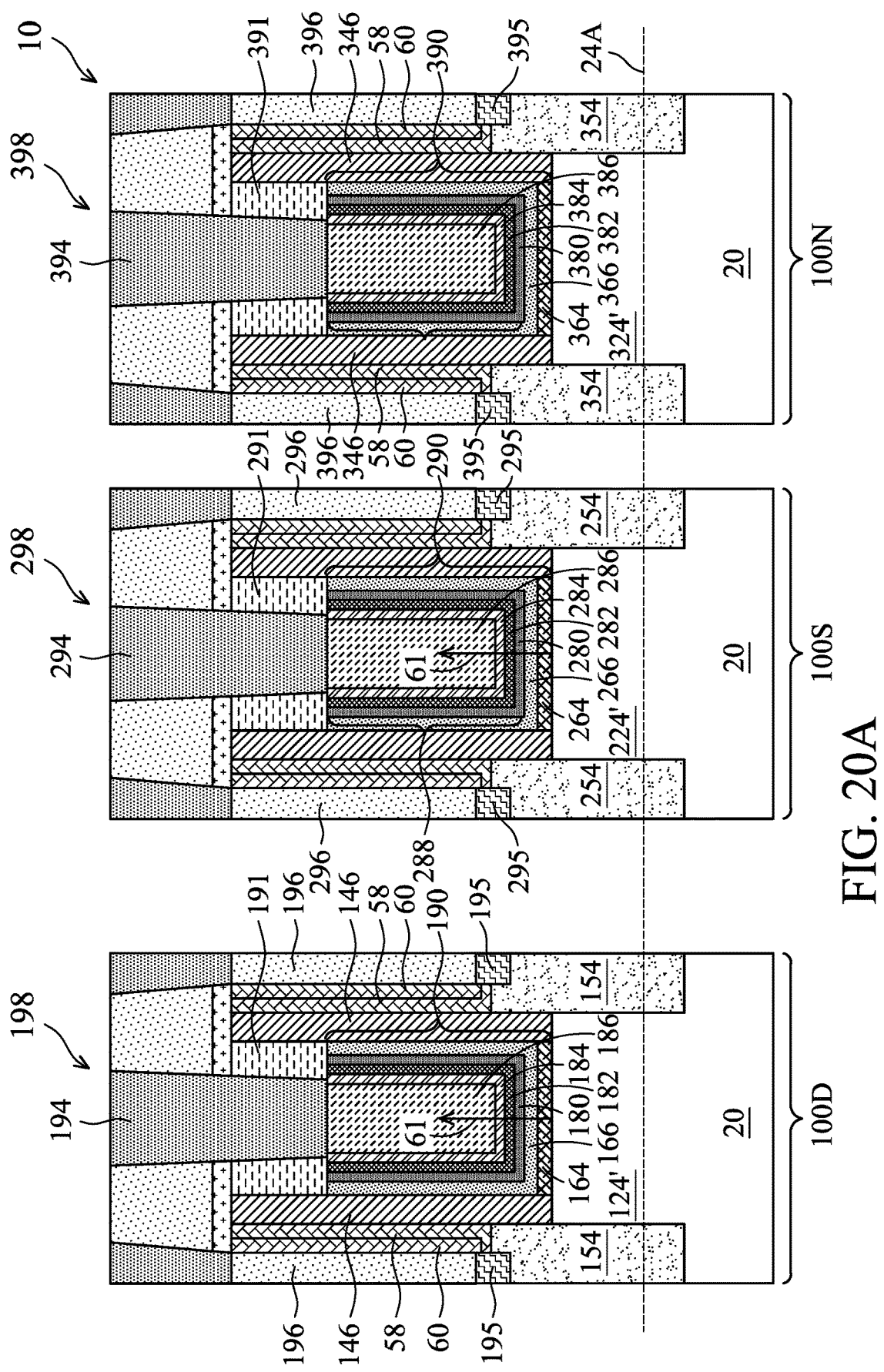

Next, a plurality of metal layers are formed over high-k dielectric layers 166, 266, and 366 to fill trenches 159, 259, and 359, respectively, and the resulting structure is shown in FIG. 19. The respective process is illustrated as process 440 in the process flow 400 shown in FIG. 25. It is appreciated that although FIG. 20A illustrates that similar layers are formed in device regions 100D, 100S, and 100N, the layer stacks in device regions 100D, 100S, and 100N may be the same as each other or different from each other. For example, when the resulting FinFETs in 100D, 100S, and 100N include different ones selected from a p-type FinFET (s) and an n-type FinFET(s), the work function layers of the FinFETs may be different from each other.

As shown in FIG. 19, the stacked layers in device region 100D may include diffusion barrier layer 180, work function layer 182 over diffusion barrier layer 180, capping layer 184 over work function layer 182, and filling-metal region 186. The stacked layers in device region 100S may include diffusion barrier layer 280, work function layer 282 over diffusion barrier layer 280, capping layer 284 over work function layer 282, and filling-metal region 286. The stacked layers in device region 100N may include diffusion barrier layer 380, work function layer 382 over diffusion barrier layer 380, capping layer 384 over work function layer 382, and filling-metal region 386. In accordance with alternative embodiments, diffusion barrier layers 180, 280, and 380 are not formed, and work-function layers 182, 282, and 382 may be in physical contact with the underlying high-k dielectric layers 166', 266', and 366, respectively.

Diffusion barrier layers 180, 280, and 380 may include TiN, TiSiN, or the like. The formation method may include ALD, CVD, or the like. Work-function layers 182, 282, and 382 may be formed through ALD, CVD, or the like. Each of Work-function layers 182, 282, and 382 may be a single layer having a homogenous composition (having same elements with same percentages of the same elements), or may include a plurality of sub-layers formed of different materials. Work-function layers 182, 282, and 382 may include materials that are selected according to whether the respective FinFETs formed in device regions 100D, 100S, and 100N are n-type FinFETs or p-type FinFETs. For example, when the FinFETs are n-type FinFETs, the corresponding work-function layers 182, 282, and 382 may include an aluminum-based layer (formed of or comprising, for example, TiAl, TiAlN, TiAlC, TaAlN, or TaAlC). When the FinFETs are p-type FinFETs, the corresponding work-function layer 182, 282, and 382 may include a TiN layer and a TaN layer.

It is appreciated that different materials and structures may be selected for the work-function layers 182, 282, and 382 to further tune the threshold voltages of the corresponding transistors. This tuning combined with the tuning through doping metal into high-k dielectric layers significantly improves the capability for tuning threshold voltages. For example, the preceding embodiments introduced three levels of threshold voltages. If three levels of threshold voltage tuning may be obtained by selecting materials and structures for work-function layers 182, 282, and 382, then there are 3×3, which is 9, levels of threshold voltage tuning.

Capping layers 184, 284, and 384 (which are also referred to as blocking layers) may be formed conformally and extending into device regions 100D, 100S, and 100N, respectively. In accordance with some embodiments, capping layers 184, 284, and 384 comprise TiN, TaN, or the like, which may be deposited using a method such as ALD, CVD, or the like.

FIG. 19 also illustrates the formation of filling-metal regions 186, 286, and 386. In accordance with some embodiments, filling-metal regions 186, 286, and 386 are formed of tungsten, cobalt, or the like, which may be deposited using ALD, CVD, or the like. In accordance with some embodiments, capping layers 184, 284, and 384 may fully fill the corresponding trenches, and the filling-metal regions are not formed.

After the trenches are fully filled, a planarization process is performed to remove excess portions of the plurality of layers, resulting in the gate stacks 190, 290, and 390 as shown in FIG. 19. Gate stacks 190, 290, and 390 include gate electrodes 188, 288, and 388, respectively.

FIG. 20A illustrates the formation of self-aligned hard masks 191, 291, and 391 in accordance with some embodiments, which may include performing an etching process to recess gate stacks 190, 290, and 390, so that recesses are formed between gate spacers 146, 246, and 346. The recesses are then filled with a dielectric material, followed by a planarization process to remove excess portions of the dielectric material. Hard masks 191, 291, and 391 may be formed of silicon nitride, silicon oxynitride, silicon oxycarbo-nitride, or the like. In addition, source/drain contact plugs 196, 296, and 396 and silicide regions 195, 295, and 395 are formed to electrically connect to source/drain regions 154, 254, and 354, respectively. Gate contact plugs 194, 294, and 394 are formed to electrically connect to gate electrodes 188, 288, and 388, respectively. FinFETs 198, 298, and 398 are thus formed in device regions 100D, 100S, and 100N, respectively.

Figure 20B:
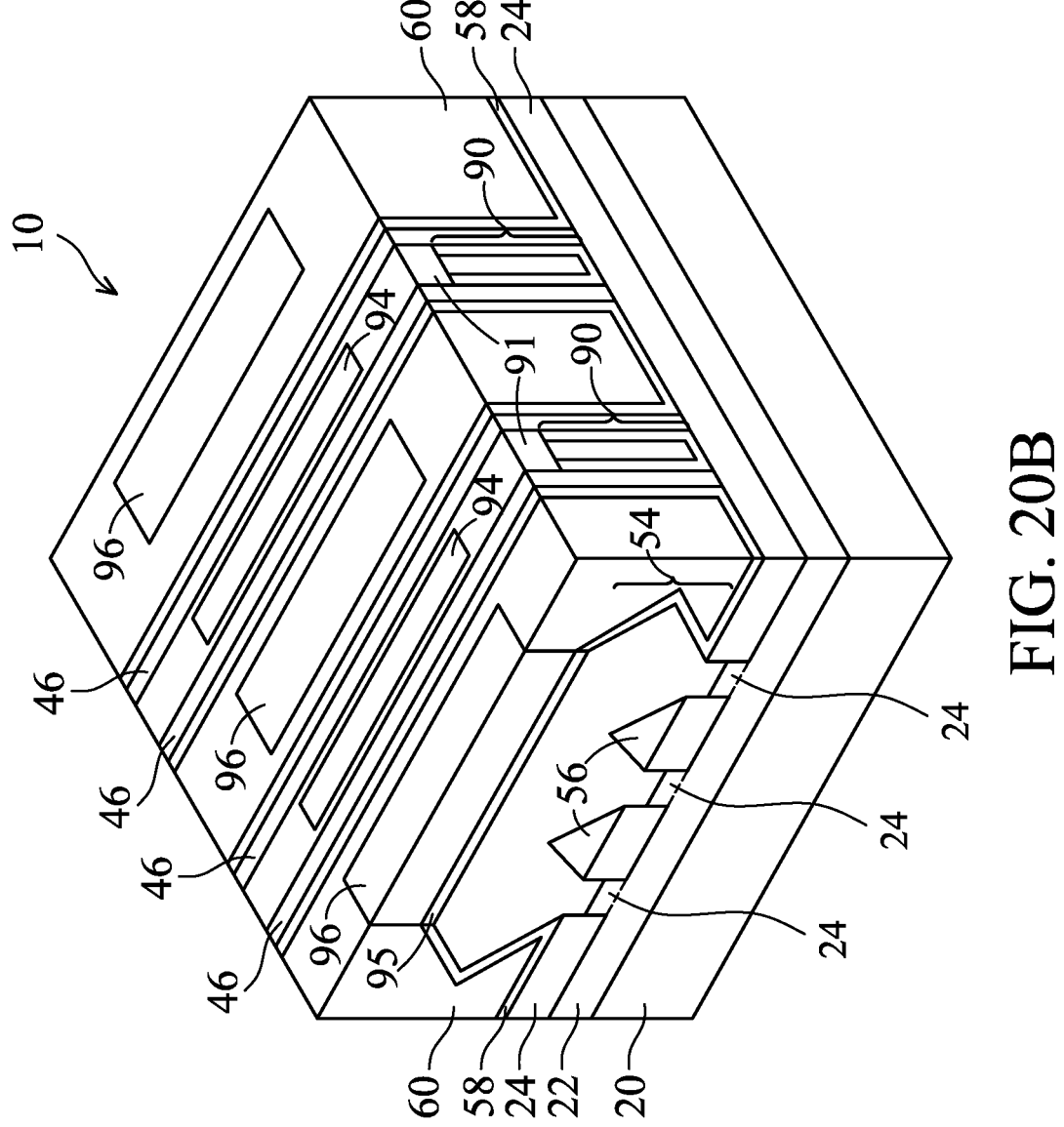

FIG. 20B illustrates a perspective view of a FinFET 98, which may represent either one of FinFETs 198, 298, and 398 as shown in FIG. 20A. Gate contact plug 94 (representing 194, 294, and 394 in FIG. 20A), source/drain silicide regions 95 (representing 195, 295, and 395), and source/drain contact plugs 96 (representing 196, 296, and 396) are also illustrated.

In the example processes as illustrated in preceding figures, three transistors with different threshold voltages are formed using two lithography processes, with one performed using etching masks 165/365, and the other one performed using etching masks 176/276. Each of the lithography processes may result in the loss of the respective high-k dielectric layers, and the loss may be in the range between about 0.5 Å and about 3 Å. Accordingly, the high-k dielectric layers are thinned, and the optimized drive-in anneal process needs to take the loss in thickness into account to ensure that the diffused doping metal reaches the bottoms of the high-k dielectric layers, but does not diffuse into the interfacial layers.

Figure 21:
FIGS. 21 through 23 illustrate the perspective views and cross-sectional views of intermediate stages in the formation of Fin Field-Effect Transistors (FinFETs) in accordance with some embodiments.
Figure 22:
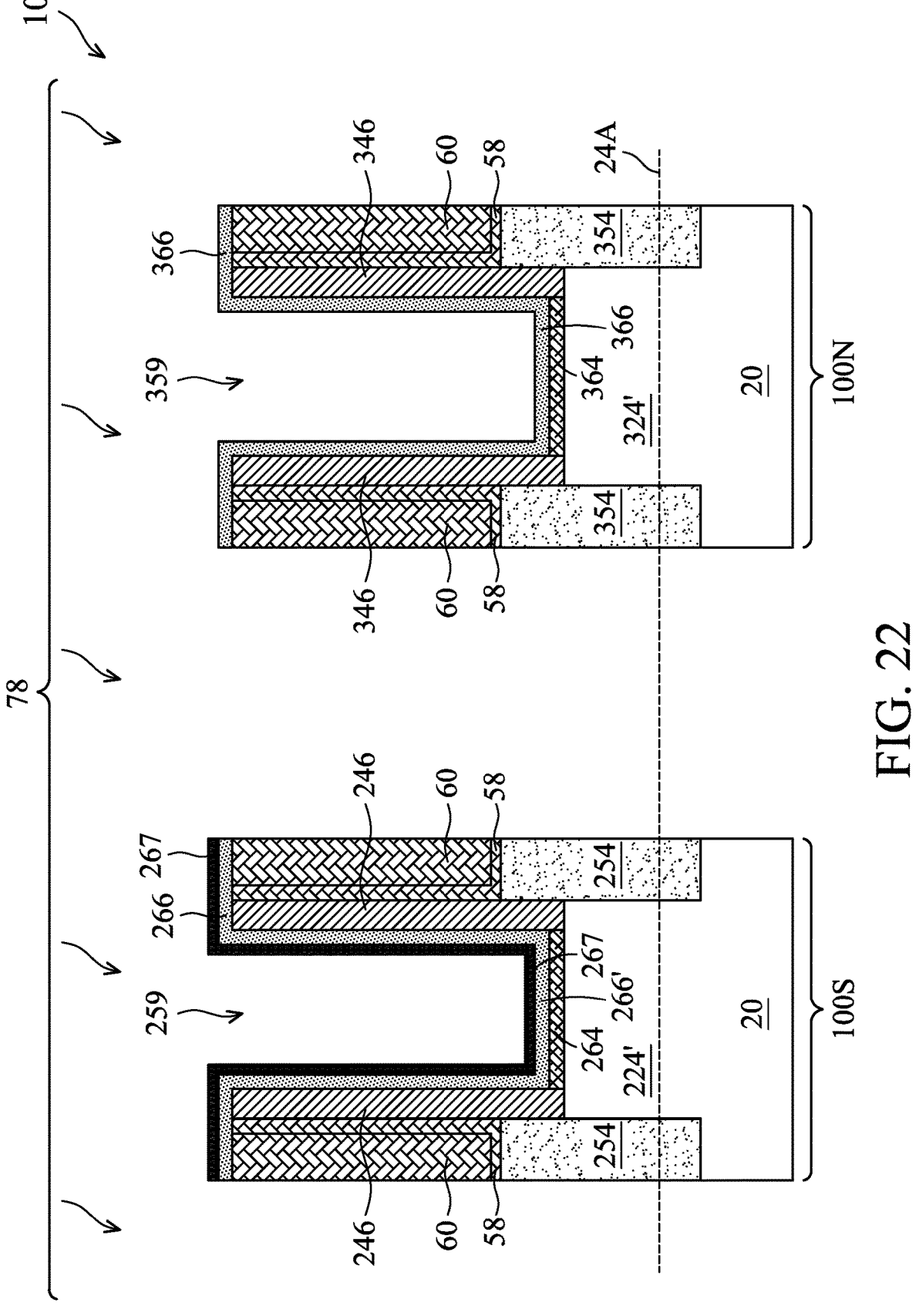
Figure 23:

FIGS. 21 through 23 illustrate cross-sectional views of intermediate stages in the formation of FinFETs in accordance with alternative embodiments of the present disclosure. These embodiments are similar to the preceding embodiments, except a single doping-metal-containing layer is used for the drive-in. Unless specified otherwise, the materials and the formation processes of the components in these embodiments are essentially the same as the like components, which are denoted by like reference numerals in the preceding embodiments shown in preceding figures. The details regarding the formation process and the materials of the components shown in FIGS. 21 through 23 may thus be found in the discussion of the preceding embodiments.

The initial steps of these embodiments are essentially the same as shown in FIGS. 1-6, 7A, 7B, 8A, 8B, and 9. Next, as shown in FIG. 21, etching mask 265 is formed. The formation is similar to the formation of etching masks 165 and 365 in FIG. 10, except etching mask 265 is left in device region 100S, while the etching mask is removed from device region 100N.

Next, etching mask 265 is used to etch hard mask 368 and doping-metal-containing layer 367, until high-k dielectric layer 366 is exposed. Next, etching mask 265 is removed, and the resulting structure is shown in FIG. 22. A drive-in anneal process 78 is then performed, similar to the corresponding process as shown in FIG. 17. Accordingly, high-k dielectric layer 266 has the doping metal doped-in from doping-metal-containing layer 267. The resulting structure is shown in FIG. 23. The resulting doped high-k dielectric layer 266 is referred to as 266'. High-k dielectric layer 366 does not have extra doping metal introduced. The subsequent processes are essentially the same as shown in FIGS. 19, 20A, and 20B, and the resulting transistors are essentially the same as the transistors 298 and 398 as shown in FIG. 20A.

It is appreciated that although a single doping-metal-containing layer and two doping-metal-containing layers are presented as examples, more doping-metal-containing layers such as three layers, four layers, or more may be used to create more levels of threshold voltage tuning.

Figure 24:
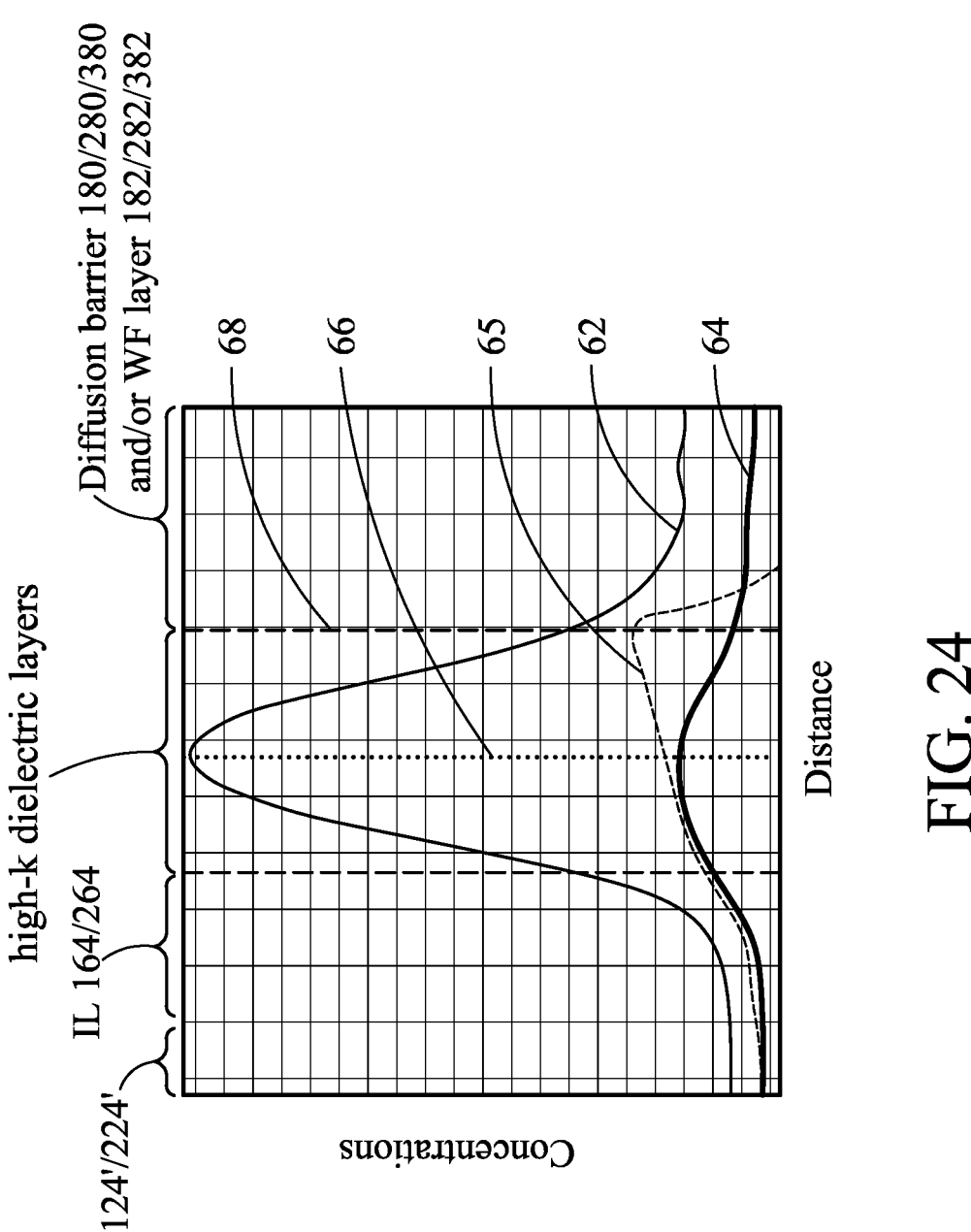
FIG. 24 illustrate example atomic percentages of Hf and La in accordance with some embodiments.

FIG. 24 illustrates the example atomic percentages of La and Hf as functions of depth into protruding fins 36 in accordance with some embodiments, wherein the depth may be measured in the direction shown by arrows 61 in FIG. 20A. The distribution of Hf represents the position of high-k dielectric layer 166' and 266' (FIG. 20A). The X-axis indicates the distances of the respective parts of gate stacks from the surfaces of protruding fins 36, and the Y-axis indicates the concentrations of Hf and La. The line 62 represents the atomic percentages of Hf in high-k dielectric layers 166' or 266' relative to the distances. The lines 64 and 65 represent the possible atomic percentages of La relative to the distances. In accordance with some embodiments as shown in FIG. 24, the peak atomic percentage of the doping metal overlaps the middle line 66 of the high-k dielectric layer (such as 166' or 266'). In accordance with alternative embodiments, the peak atomic percentage of the doping metal may be shifted toward right, for example, to any position between (and including) line 68 and line 66. In accordance with alternative embodiments, the peak atomic percentage of the doping metal may be shifted toward left of line 66. In accordance with some embodiments, by carefully controlling the drive-in process, the peak atomic percentages of the doping metal may be close to the interface between ILs and the corresponding overlying high-k dielectric layers.

Figure 26:
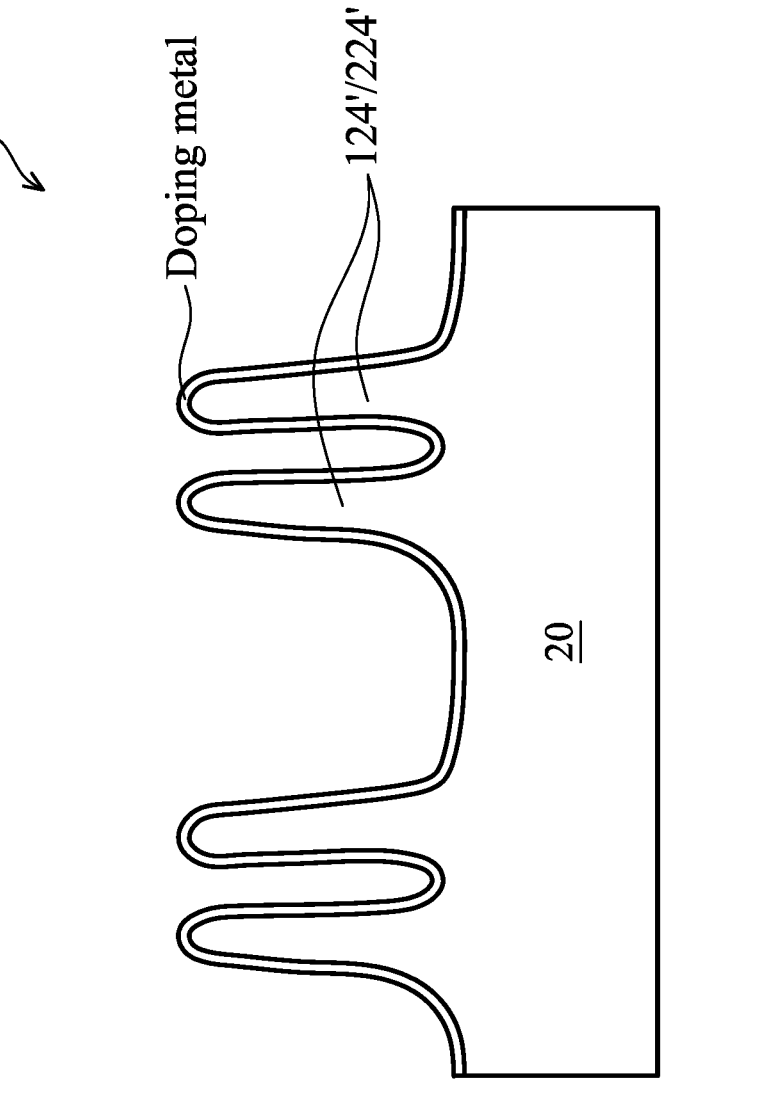
FIG. 26 illustrates possible positions where the doping metal may be found in accordance with some embodiments.

FIG. 26 illustrate an example profile of protruding fins 124'/224' and the positions where the doping metal (such as La) may be found in wafer 10. FIG. 26 shows that the doping metal is distributed close to the surface of protruding fins 124'/224' and substrate 20.

The embodiments of the present disclosure have some advantageous features. By selectively removing the doping-metal-containing layers from the high-k dielectric layers of some transistors, the doping metal may be selectively doped into some transistors to tune the corresponding threshold voltages. Furthermore, by selectively applying fewer or more layers of doping-metal-containing layers, different levels of threshold voltage tuning may be achieved. These levels of threshold voltage tuning may be combined with the tuning of threshold voltages through the adjustment of materials and structures of work function layers to achieve even more levels of tuning.

In accordance with some embodiments of the present disclosure, a method comprises forming a first gate dielectric, a second gate dielectric, and a third gate dielectric over a first semiconductor region, a second semiconductor region, and a third semiconductor region, respectively; depositing a first lanthanum-containing layer overlapping the first gate dielectric; depositing a second lanthanum-containing layer overlapping the second gate dielectric, wherein the second lanthanum-containing layer is thinner than the first lanthanum-containing layer; and performing an anneal process to drive lanthanum in the first lanthanum-containing layer and the second lanthanum-containing layer into the first gate dielectric and the second gate dielectric, respectively, wherein during the anneal process, the third gate dielectric is free from lanthanum-containing layers thereon. In an embodiment, the depositing the second lanthanum-containing layer comprises depositing a first blanket lanthanum-containing layer overlapping the first gate dielectric, the second gate dielectric, and the third gate dielectric; removing the first blanket lanthanum-containing layer from a first region overlying the second semiconductor region; and depositing a second blanket lanthanum-containing layer overlapping the first gate dielectric, the second gate dielectric, and the third gate dielectric. In an embodiment, the first lanthanum-containing layer comprises portions of both of the first blanket lanthanum-containing layer and the second blanket lanthanum-containing layer. In an embodiment, the method further comprises, before the anneal process, removing both of the first blanket lanthanum-containing layer and the second blanket lanthanum-containing layer from a second region overlying the third gate dielectric. In an embodiment, the first blanket lanthanum-containing layer and the second blanket lanthanum-containing layer are removed from the second region using a same etching mask. In an embodiment, the first gate dielectric comprises a silicon oxide layer and a high-k dielectric layer over the silicon oxide layer, and the lanthanum is driven to an interface between the silicon oxide layer and the high-k dielectric layer. In an embodiment, the method further comprises, after the anneal process, removing the first lanthanum-containing layer and the second lanthanum-containing layer. In an embodiment, the depositing the first lanthanum-containing layer comprises depositing a lanthanum oxide layer.

In accordance with some embodiments of the present disclosure, a device comprises a first transistor comprising a first semiconductor region; a first high-k dielectric over the first semiconductor region, wherein the first high-k dielectric comprises a first high-k dielectric material and lanthanum with a first lanthanum atomic percentage; and a first work-function layer over the first high-k dielectric; and a second transistor comprising a second semiconductor region; a second high-k dielectric over the second semiconductor region, wherein the second high-k dielectric comprises the first high-k dielectric material and lanthanum with a second lanthanum atomic percentage, and wherein the second lanthanum atomic percentage is lower than the first lanthanum atomic percentage; and a second work-function layer over the second high-k dielectric, wherein the first work-function layer and the second work-function layer are formed of same materials. In an embodiment, lanthanum is distributed throughout an entirety of the second high-k dielectric. In an embodiment, the device further comprises a silicon oxide layer between the second semiconductor region and the second high-k dielectric, wherein the silicon oxide layer is substantially free from lanthanum. In an embodiment, the device further comprises a third transistor comprising a third semiconductor region; a third high-k dielectric over the third semiconductor region, wherein the third high-k dielectric comprises the first high-k dielectric material, and is free from lanthanum; and a third work-function layer over the third high-k dielectric, wherein the first work-function layer and the third work-function layer are formed of same materials. In an embodiment, the first lanthanum atomic percentage is equal to about twice the second lanthanum atomic percentage. In an embodiment, both of the first transistor and the second transistor are n-type transistors. In an embodiment, both of the first transistor and the second transistor are p-type transistors.

In accordance with some embodiments of the present disclosure, a device comprises a bulk semiconductor substrate; a first semiconductor fin, a second semiconductor fin, and a third semiconductor fin over the bulk semiconductor substrate; a first gate stack on a first sidewall and a first top surface of the first semiconductor fin, the first gate stack comprising a first interfacial layer; and a first high-k dielectric on the first interfacial layer, wherein the first high-k dielectric has a first lanthanum atomic percentage; a second gate stack on a second sidewall and a second top surface of the second semiconductor fin, the second gate stack comprising a second interfacial layer; and a second high-k dielectric on the second interfacial layer, wherein the second high-k dielectric has a second lanthanum atomic percentage lower than the first lanthanum atomic percentage; and a third gate stack on a third sidewall and a third top surface of the third semiconductor fin, the third gate stack comprising a third interfacial layer; and a third high-k dielectric on the third interfacial layer, wherein the third high-k dielectric has a third lanthanum atomic percentage lower than the second lanthanum atomic percentage. In an embodiment, the third lanthanum atomic percentage is equal to zero. In an embodiment, the first lanthanum atomic percentage is equal to or greater than twice the second lanthanum atomic percentage. In an embodiment, the device further comprises a first transistor comprising the first gate stack, wherein the first transistor has a first threshold voltage; a second transistor comprising the second gate stack, wherein the second transistor has a second threshold voltage; and a third transistor comprising the third gate stack, wherein the third transistor has a third threshold voltage, and the first threshold voltage, the second threshold voltage, and the third threshold voltage are different from each other. In an embodiment, the first transistor, the second transistor, and the third transistor are n-type transistors, and the first threshold voltage is lower than the second threshold voltage, and the second threshold voltage is lower than the third threshold voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first transistor comprising:
      a first semiconductor region;
      a first high-k dielectric over the first semiconductor region, wherein the first high-k dielectric comprises a first high-k dielectric material and lanthanum with a first lanthanum atomic percentage; and
      a first work-function layer over the first high-k dielectric; and
   a second transistor, wherein both of the first transistor and the second transistor are n-type transistors, and wherein the second transistor comprises:
      a second semiconductor region;
      a second high-k dielectric over the second semiconductor region, wherein the second high-k dielectric comprises the first high-k dielectric material and lanthanum with a second lanthanum atomic percentage, and wherein the second lanthanum atomic percentage is lower than the first lanthanum atomic percentage; and
      a second work-function layer over the second high-k dielectric, wherein the first work-function layer and the second work-function layer are formed of same materials.

2. The device of claim 1, wherein lanthanum is distributed throughout an entirety of the second high-k dielectric.

3. The device of claim 2 further comprising a silicon oxide layer between the second semiconductor region and the second high-k dielectric, wherein the silicon oxide layer is substantially free from lanthanum.

4. The device of claim 1 further comprising a third transistor comprising:
   a third semiconductor region;
   a third high-k dielectric over the third semiconductor region, wherein the third high-k dielectric comprises the first high-k dielectric material, and is free from lanthanum; and
   a third work-function layer over the third high-k dielectric, wherein the first work-function layer and the third work-function layer are formed of same materials.

5. The device of claim 1, wherein the first lanthanum atomic percentage is equal to about twice the second lanthanum atomic percentage.

6. The device of claim 1, wherein the first work-function layer and the second work-function layer comprise different materials.

7. A device comprising:
   a bulk semiconductor substrate;
   a first semiconductor fin, a second semiconductor fin, and a third semiconductor fin over the bulk semiconductor substrate;
   a first gate stack on a first sidewall and a first top surface of the first semiconductor fin, the first gate stack comprising:
      a first interfacial layer;
      a first high-k dielectric on the first interfacial layer, wherein the first high-k dielectric has a first lanthanum atomic percentage; and
      a conductive layer over and contacting the first high-k dielectric, wherein a peak lanthanum atomic percentage is at an interface between the first high-k dielectric and the conductive layer;
   a second gate stack on a second sidewall and a second top surface of the second semiconductor fin, the second gate stack comprising:
      a second interfacial layer; and
      a second high-k dielectric on the second interfacial layer, wherein the second high-k dielectric has a second lanthanum atomic percentage lower than the first lanthanum atomic percentage; and
   a third gate stack on a third sidewall and a third top surface of the third semiconductor fin, the third gate stack comprising:
      a third interfacial layer; and
      a third high-k dielectric on the third interfacial layer, wherein the third high-k dielectric has a third lanthanum atomic percentage lower than the second lanthanum atomic percentage.

8. The device of claim 7, wherein the third lanthanum atomic percentage is equal to zero.

9. The device of claim 7, wherein the first lanthanum atomic percentage is equal to or greater than twice the second lanthanum atomic percentage.

10. The device of claim 7 further comprising:
   a first transistor comprising the first gate stack, wherein the first transistor has a first threshold voltage;
   a second transistor comprising the second gate stack, wherein the second transistor has a second threshold voltage; and
   a third transistor comprising the third gate stack, wherein the third transistor has a third threshold voltage, and the first threshold voltage, the second threshold voltage, and the third threshold voltage are different from each other.

11. The device of claim 10, wherein the first transistor, the second transistor, and the third transistor are n-type transistors, and the first threshold voltage is lower than the second threshold voltage, and the second threshold voltage is lower than the third threshold voltage.

12. The device of claim 7, wherein a peak value of the first lanthanum atomic percentage is in middle between a top surface and a bottom surface of the first high-k dielectric.

13. The device of claim 7, wherein the first gate stack further comprises a gate electrode over the first high-k dielectric, and a peak value of the first lanthanum atomic percentage is at an interface between the gate electrode and the first high-k dielectric.

14. The device of claim 13, wherein in locations away from the interface, the first lanthanum atomic percentage drops slower in the first high-k dielectric than in the gate electrode.

15. The device of claim 7, wherein the first gate stack and the second gate stack are comprised in a first n-type transistor and a second n-type transistor, respectively.

16. A device comprising:

a first semiconductor region and a second semiconductor region;

a first gate stack comprising:

a first gate dielectric on the first semiconductor region, wherein the first gate dielectric comprises first elements and a doping metal, and wherein the first gate dielectric has a first atomic percentage of the doping metal; and a first work function layer over the first gate dielectric;

a first source/drain region aside of the first gate stack;

a second gate stack comprising:

a second gate dielectric on the second semiconductor region, wherein the second gate dielectric comprises second elements and the doping metal, wherein the first elements are same as the second elements, wherein the second gate dielectric has a second atomic percentage of the doping metal, and wherein the second atomic percentage is lower than the first atomic percentage; and a second work function layer over the second gate dielectric, wherein the first work function layer and the second work function layer comprise same elements; and a second source/drain region aside of the second gate stack, wherein both of the first source/drain region and the second source/drain region are n-type semiconductor regions.

17. The device of claim 16, wherein the doping metal comprises lanthanum.

18. The device of claim 16, wherein the first atomic percentage is greater than two times the second atomic percentage.

19. The device of claim 16, wherein the first atomic percentage has a peak value at a top surface of the first gate dielectric.

20. The device of claim 16, wherein the doping metal comprises yttrium.

* * * * *